United States Patent [19]

Pass et al.

[11] Patent Number: 6,122,209

[45] Date of Patent: Sep. 19, 2000

[54] METHOD OF MARGIN TESTING PROGRAMMABLE INTERCONNECT CELL

[75] Inventors: Christopher J. Pass, San Jose; James D. Sansbury, Portola Valley; Raminda U. Madurawe, Sunnyvale; John E. Turner, Santa Cruz; Rakesh H. Patel, Cupertino; Peter J. Wright, Sunnyvale, all of Calif.

[73] Assignee: Altera Corporation, San Jose, Calif.

[21] Appl. No.: 09/350,084

[22] Filed: Jul. 8, 1999

Related U.S. Application Data

[62] Division of application No. 08/741,082, Oct. 30, 1996, Pat. No. 5,949,710
[60] Provisional application No. 60/016,881, May 6, 1996, and provisional application No. 60/015,120, Apr. 10, 1996.

[51] Int. Cl.[7] .................................................. G11C 7/00
[52] U.S. Cl. ...................... 365/201; 365/185.05; 365/63; 365/72
[58] Field of Search .............................. 365/185.05, 201, 365/63, 72

[56] References Cited

U.S. PATENT DOCUMENTS

| | | | |
|---|---|---|---|
| 4,132,904 | 1/1979 | Harari | 307/238 |
| 4,546,454 | 10/1985 | Gupta et al. | 365/200 |
| 4,596,938 | 6/1986 | Cartwright, Jr. | 307/279 |
| 4,609,986 | 9/1986 | Hartmann et al. | 364/200 |
| 4,617,479 | 10/1986 | Hartmann et al. | 307/465 |
| 4,628,487 | 12/1986 | Smayling | 365/185 |
| 4,652,773 | 3/1987 | Cartwright, Jr. | 307/469 |
| 4,677,318 | 6/1987 | Veenstra et al. | 307/465 |
| 4,713,792 | 12/1987 | Hartmann et al. | 364/900 |
| 4,829,203 | 5/1989 | Ashmore, Jr. | 307/469 |
| 4,871,930 | 10/1989 | Wong et al. | 307/465 |
| 4,885,719 | 12/1989 | Brahmbhatt | 365/181 |
| 4,899,067 | 2/1990 | So et al. | 307/465 |
| 4,912,342 | 3/1990 | Wong et al. | 307/465 |
| 4,924,119 | 5/1990 | Lee | 307/469 |
| 4,935,648 | 6/1990 | Radjy et al. | 307/468 |
| 4,979,146 | 12/1990 | Yokoyama et al. | 365/185 |
| 5,005,155 | 4/1991 | Radjy et al. | 365/185 |
| 5,016,217 | 5/1991 | Brahmbhatt | 365/185.05 |
| 5,021,693 | 6/1991 | Shima | 307/494 |
| 5,028,810 | 7/1991 | Castro et al. | 307/201 |
| 5,043,941 | 8/1991 | Sakamoto | 365/185 |
| 5,097,449 | 3/1992 | Cuevas | 365/228 |
| 5,121,006 | 6/1992 | Pedersen et al. | 307/465 |
| 5,241,224 | 8/1993 | Pedersen et al. | 307/465 |
| 5,247,478 | 9/1993 | Gupta et al. | 365/185 |
| 5,251,169 | 10/1993 | Josephson | 365/185.05 |
| 5,260,610 | 11/1993 | Pedersen et al. | 307/465 |
| 5,260,611 | 11/1993 | Cliff et al. | 307/465 |
| 5,350,954 | 9/1994 | Patel et al. | 307/465 |
| 5,353,248 | 10/1994 | Gupta | 365/154 |
| 5,457,653 | 10/1995 | Lipp | 365/185.18 |
| 5,696,716 | 12/1997 | Rolandi | 365/185.05 |
| 5,764,096 | 6/1998 | Lipp et al. . | |
| B1 4,617,479 | 9/1993 | Hartmann et al. | 307/465 |

FOREIGN PATENT DOCUMENTS

| | | |
|---|---|---|
| WO 94/22142 | 9/1994 | WIPO . |
| WO 96/01474 | 1/1996 | WIPO . |
| WO 96/01499 | 1/1996 | WIPO . |

OTHER PUBLICATIONS

"Non–Volatile, and High Density Rewritable FPGA Developed Logic Change Becomes Possible on Board," The Nikkei Micro Devices, Jul. 1995, p. 262, and translation.

*Primary Examiner*—Richard Elms
*Assistant Examiner*—Tuan T. Nguyen
*Attorney, Agent, or Firm*—Townsend and Townsend and Crew LLP

[57] ABSTRACT

A static, nonvolatile, and reprogrammable programmable interconnect junction cell for implementing programmable interconnect in an integrated circuit. The programmable interconnect junction (600) is programmably configured to couple or decouple a first interconnect line (210) and a second interconnect line (220). The configured state of the programmable interconnect junction is detected directly, and memory cell detection circuitry such as sense amplifiers are not needed during normal operation. Full-rail voltages may be passed from the first interconnect line and the second interconnect line.

15 Claims, 17 Drawing Sheets

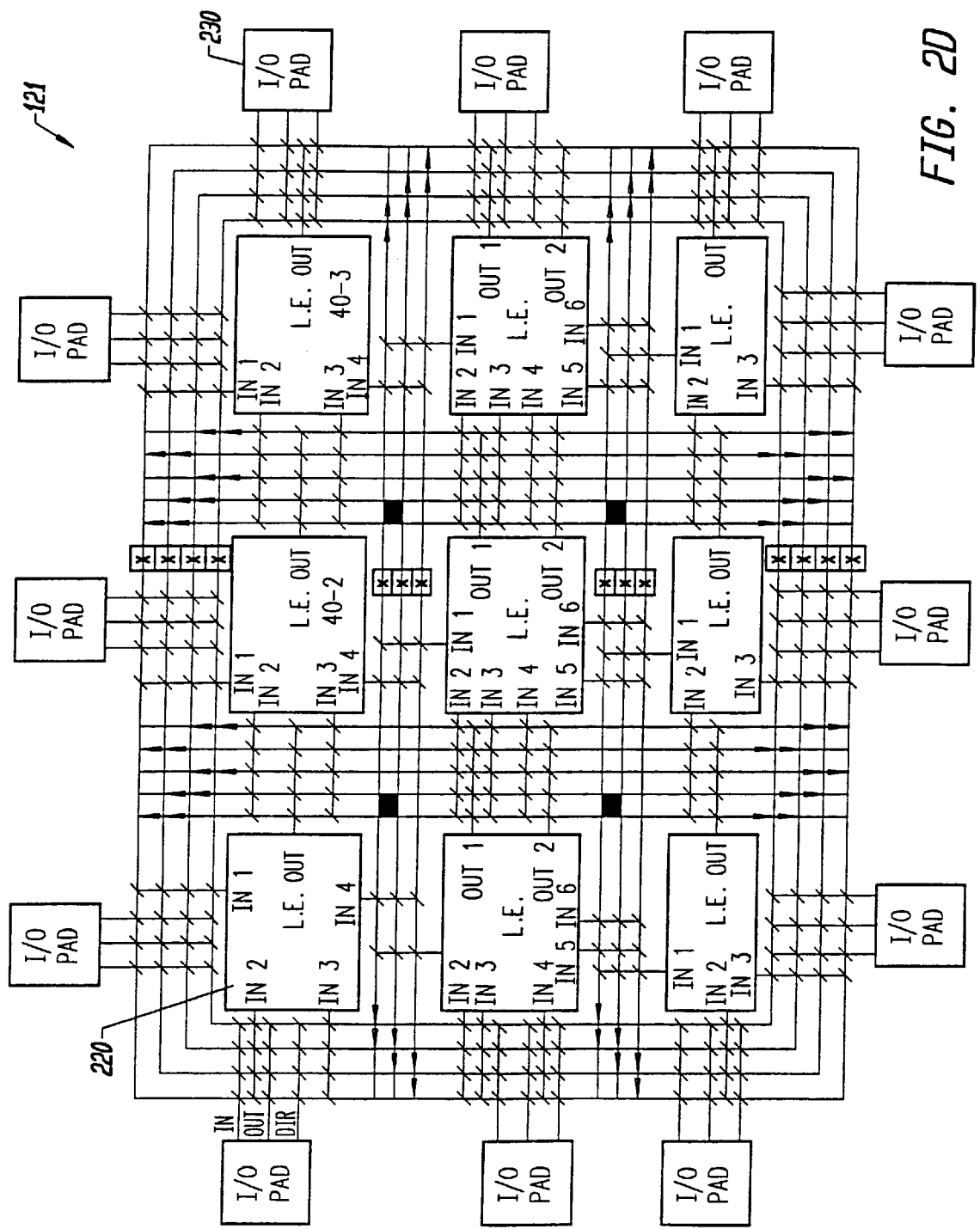

METHOD OF MARGIN TESTING PROGRAMMABLE INTERCONNECT CELL

This application is a division of U.S. patent application Ser. No. 08/741,082, filed Oct. 30, 1996, now U.S. Pat. No. 5,949,710 issued Sep. 7, 1999 which claims the benefit of U.S. provisional applications 60/016,881, filed May 6, 1996, and 60/015,120, filed Apr. 10, 1996, which are all incorporated by reference.

BACKGROUND OF THE INVENTION

The present invention relates to the field of integrated circuit interconnection technology. More specifically, the present invention provides a static, nonvolatile programmable interconnect junction.

Interconnect is a fundamental component of integrated circuits. Interconnect is used to couple the elements, components, circuits, and signals in an electronic system together in order to perform functions. For example, interconnect is used to supply power to the electronic components. Interconnect is also used to implement analog and digital functions in electronic systems. Interconnect, especially programmable or configurable interconnect, is especially useful in particular applications, such as, but not limited to, programmable logic devices (PLDs) where it is desirable for interconnections to be programmably determined. Other applications may include microprocessors, memories, and application specific integrated circuits (ASICs), to name a few.

PLDs are well known to those in the electronic art. Programmable logic devices are commonly referred to as PALs (Programmable Array Logic), PLAs (Programmable Logic Arrays), FPLAs, PLDs, EPLDs (Erasable Programmable Logic Devices), EEPLDs (Electrically Erasable Programmable Logic Devices), LCAs (Logic Cell Arrays), FPGAs (Field Programmable Gate Arrays), and the like. Such devices are used in a wide array of applications where it is desirable to program standard, off-the-shelf devices for a specific application. Such devices include, for example, the well-known, Classic™, and MAX® 5000, MAX® 7000, and FLEX® 8000 EPLDs made by Altera Corp.

PLDs are generally known in which many logic array blocks (LABs) are provided in a two-dimensional array. LABs contain a number of individual programmable logic elements (LEs) which provide relatively elementary logic functions such as NAND, NOR, and exclusive OR. The functions within LABs and LEs may be implemented using function generators, look-up tables, AND-OR arrays, product terms, multiplexers, and a multitude of other techniques. Further, PLDs have an array of intersecting signal conductors for programmably selecting and conducting logic signals to, from, and between the LABs and LEs.

The configuration information of the LABs, LEs, and interconnections between these logical elements have been typically stored in memory cells. Memory cells may be used to programmably control the composition, configuration, and arrangements of logic array blocks (LABs) and logic elements (LEs) and also the interconnections between these logic array blocks and logic elements.

Many different memory cell technologies may be used including dynamic random access memory (DRAM), static random access memory (SRAM), erasable-programmable read only memory (EPROM), electrically erasable programmable read only memory (EEPROM), Flash EEPROM memory, and antifuse, among others. Typically, the technology used to store the configuration information of the PLD should be compact, power efficient, programmable and nonvolatile, require little additional programming circuitry overhead, and generally provide enhancements to the performance and features of PLD logic modules and interconnections.

While PLDs have met with substantial success, such devices also meet with certain limitations. There is a continuing need for programmable logic integrated circuits with greater capacity, density, functionality, and performance. Resulting from the continued scaling and shrinking of semiconductor device geometries which are used to form integrated circuits (also known as "chips"), integrated circuits have progressively become smaller and denser. For programmable logic, it becomes possible to put greater numbers of programmable logic elements onto one integrated circuit. As the number of elements increases, it becomes increasingly important to improve the techniques and architectures used for programmably interconnecting the elements and routing signals between the logic blocks. Also as PLDs increase in size and complexity, greater numbers of memory cells are required to hold the configuration information of the logical elements and many programmable interconnections are needed.

This produces a need to implement logic functions more efficiently and to improve the portion of the device which is devoted to interconnecting individual logic modules. The provision of additional or alternative techniques for implementing the programmable interconnection between the logic modules should have benefits sufficient to justify the additional circuitry and programming complexity. The capacity, complexity, and performance of PLDs are determined in a large part by the techniques used to implement the logic elements and interconnections. The techniques used to implement the logic and programmable interconnect should have improved operating characteristics such as lower power consumption, nonvolatility, greater device longevity, improved data retention, better transient performance, and superior voltage and current attributes, as well as many other characteristics. Furthermore, the technology should facilitate manufacturability and testability.

As can be seen, improved techniques for implementing programmable interconnect are needed, especially for implementing the logic and interconnects in a programmable integrated circuit.

SUMMARY OF THE INVENTION

The present invention provides a static, nonvolatile, and reprogrammable programmable interconnect junction cell for implementing programmable interconnect in an integrated circuit. The programmable interconnect cell is programmably configured to couple or decouple a first interconnect line and a second interconnect line. The configured state of the programmable interconnect junction is detected directly, and memory cell detection circuitry such as sense amplifiers are not needed. Full-rail voltages may be passed from the first interconnect line and the second interconnect line.

To facilitate ease-of-operation and manufacturability, the programmable interconnect cell may be implemented using EEPROM or Flash EEPROM technologies, as well as many others. The programmable interconnect facilitates straightforward margin testing, even when configured in an array, to ensure the integrity of the individual devices. The layout of the programmable interconnect junction cell is compact, saving silicon area in an integrated circuit. The programmable interconnect junction cell also consumes practically zero power.

More specifically, a programmable interconnect junction cell of the present invention includes a first interconnect line and a second interconnect line. An interconnect element programmably couples the first interconnect line and the second interconnect line. A floating gate programmably controls the interconnect element which couples and decouples the first and second interconnect lines. And, a margin device is coupled to permit evaluation of a programming margin of the floating gate. The margin device may include a serially coupled first transistor and second transistor, where the floating gate is a gate of the second transistor. The interconnect element and second transistor may be floating gate devices.

Further, the present invention is a semiconductor structure including a floating gate and a row-line conductor. In a first active region, a switch transistor is formed by the floating gate. The floating gate programmably couples a first node of the switch transistor and a second node of the switch transistor. In a second active region, a read transistor is formed by the row-line conductor; and, a program transistor is formed by the floating gate and is serially coupled to the read transistor.

Moreover, the present invention is a semiconductor structure including a floating gate and a row-line conductor. In a first active region, a switch transistor is controlled by the floating gate to programmably couple a first node of the switch transistor and a second node of the switch transistor. In a second active region, a read transistor has a control node coupled to the row-line conductor. And, a program transistor is serially coupled with the read transistor and controlled by the floating gate. In a third active region, a tunnel diode is formed beneath a tunnel dielectric and the floating gate. Charge is transferred between the tunnel diode and the floating gate through the tunnel dielectric. In a fourth active region, a control gate capacitor is coupled to the floating gate.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 2D is a block diagram showing a segmented programmable interconnect architecture for a programmable logic device;

DETAILED DESCRIPTION

Figure 1:
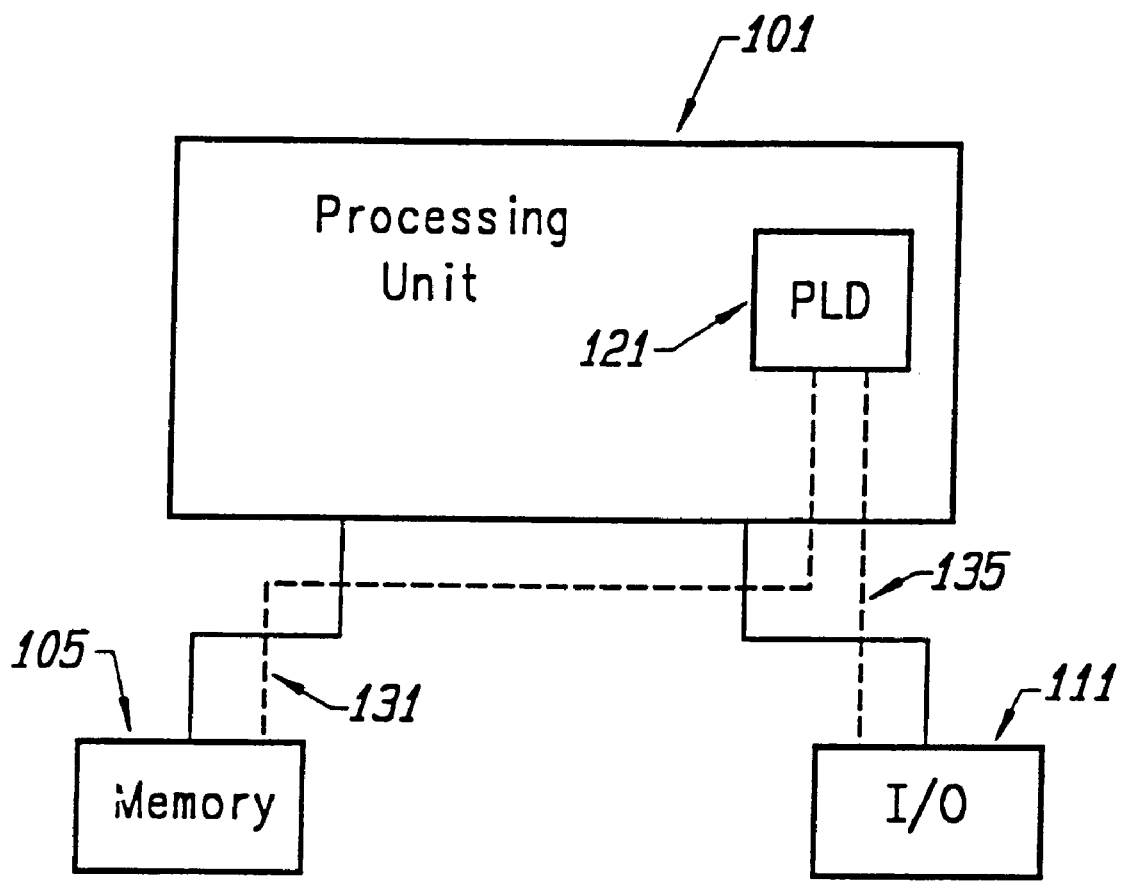
FIG. 1 is a block diagram of a digital system incorporating a programmable logic device integrated circuit.

FIG. 1 shows a block diagram of a digital system within which the present invention may be embodied. The system may be provided on a single board, on multiple boards, or even within multiple enclosures. FIG. 1 illustrates a system 101 in which a programmable logic device 121 may be utilized. Programmable logic devices (sometimes referred to as a PALs, PLAs, FPLAs, PLDs, EPLDs, EEPLDs, LCAs, or FPGAs), are well known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated herein by reference for all purposes. Such devices are currently represented by, for example, Altera's MAX® series of PLDs and FLEX® series of PLDs. The former are described in, for example, U.S. Pat. Nos. 5,241,224 and 4,871,930, and the *Altera Data Book*, June 1996, all incorporated herein by reference. The latter are described in, for example, U.S. Pat. Nos. 5,258,668, 5,260, 610, 5,260,611, and 5,436,575, and the *Altera Data Book*, June 1996, all incorporated herein by reference for all purposes. Logic devices and their operation are well known to those of skill in the art.

In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system. In some embodiments, processing unit 101 may even be a computer system. Memory 105 may he a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2A:
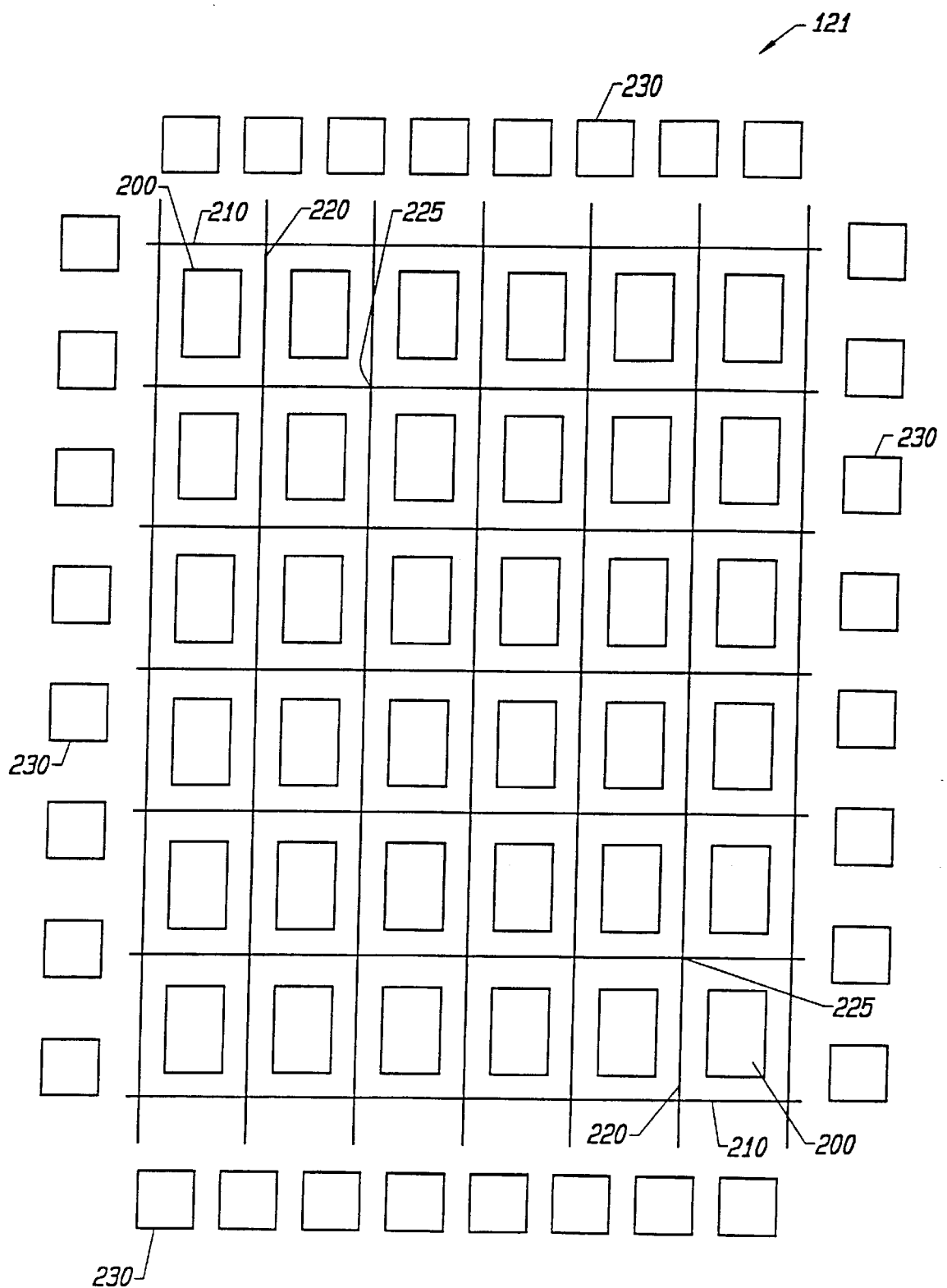
FIG. 2A is a block diagram showing an architecture for a programmable logic device.
Figure 2B:
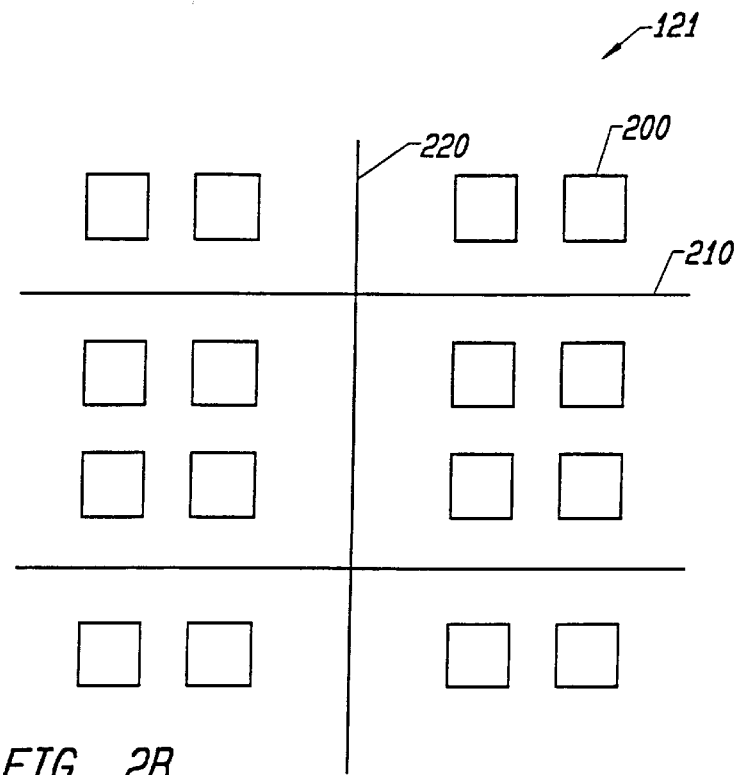
FIG. 2B is a block diagram showing an architecture for a programmable logic device.
Figure 2C:
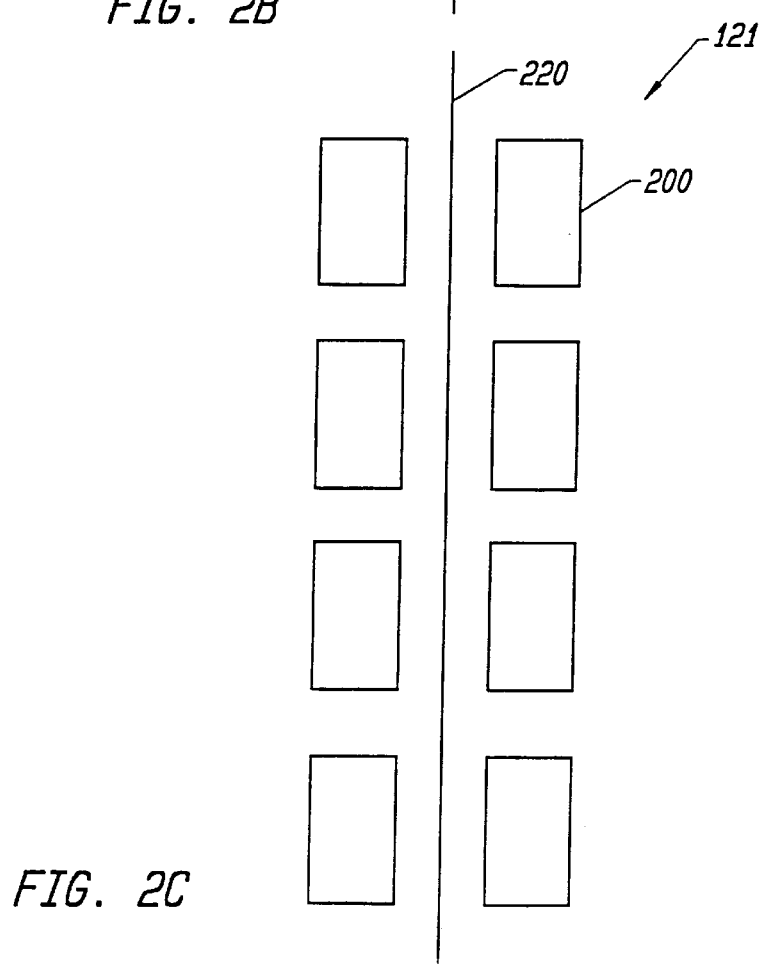
FIG. 2C is a block diagram showing an architecture for a programmable logic device.

FIG. 2A is a simplified block diagram of an overall internal architecture and organization of PLD 121 of FIG. 1. Other architectures are shown in FIGS. 2B–D. Many details of PLD architecture, organization, and circuit design are not necessary for an understanding of the present invention and such details are not shown in FIGS. 2A–D.

FIG. 2A shows a six-by-six two-dimensional array of thirty-six logic array blocks (LABs) 200. LAB 200 is a physically grouped set of logical resources that is configured or programmed to perform logical functions. The internal architecture of a LAB will be described in more detail below in connection with FIG. 3. PLDs may contain any arbitrary number of LABs, more or less than shown in PLD 121 of FIG. 2A. Generally, in the future, as technology advances and improves, programmable logic devices with greater numbers of logic array blocks will undoubtedly be created. Furthermore, LABs 200 need not be organized in a square matrix; for example, the array may be organized in a five-by-seven or a twenty-by-seventy matrix of LABs.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2A, each GH 210 and GV 220 line may represent a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location on PLD 121 to another LAB 200 at another location on PLD 121. A signal may pass through a plurality of intersections 225. Furthermore, an output signal from one LAB 200 can be directed into the inputs of one or more LABs 200. Also, using the global interconnect, signals from a LAB 200 can be fed back into the same LAB 200. In specific embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

The PLD architecture in FIG. 2A further shows at the peripheries of the chip, input-output drivers 230. Input-output drivers 230 are for interfacing the PLD to external, off-chip circuitry. FIG. 2A shows thirty-two input-output drivers 230; however, a PLD may contain any number of input-output drivers, more or less than the number depicted. Each input-output driver 230 is configurable for use as an input driver, output driver, or bidirectional driver.

FIG. 2B shows a simplified block diagram of an alternative PLD architecture. In this embodiment, a plurality of LABs 200 may be programmably coupled using GHs 210 and GV 220. This architecture may also have input-output drivers 230, but are not shown in order to simplify the diagram. The input-output driver functions may also be incorporated within LABs 200, or some LABs 200. The memory cell of the present invention may be used to store the configuration of the components of this PLD architecture.

FIG. 2C shows a simplified block diagram of another PLD architecture. In this embodiment, a plurality of LABs 200 may be programmably coupled using GV 220. This architecture may also have input-output drivers 230, but are not shown in order to simplify the diagram. The memory cell of the present invention may be used to store the configuration of the components of this PLD architecture.

Figure 2E:
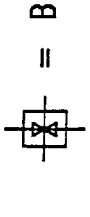
FIG. 2E shows a description of the meanings of the symbols used in FIG. 2D.

FIG. 2D shows a block diagram of another PLD architecture. In this embodiment, a plurality of LABs 200 may be programmably coupled using a "segmented" programmable interconnect. FIG. 2E shows a description of the meanings of the interconnect symbols used in FIG. 2D. A plurality of input-output drivers 230 surround the LABs 200. The architecture in FIG. 2D has segmented programmable interconnect, where signals and LABs 200 are coupled using programmable interconnect segments, which do not necessarily run the entire length of a row or column of LABs 200. The memory cell of the present invention may be used to store the configuration of the components of this PLD architecture.

Figure 3:
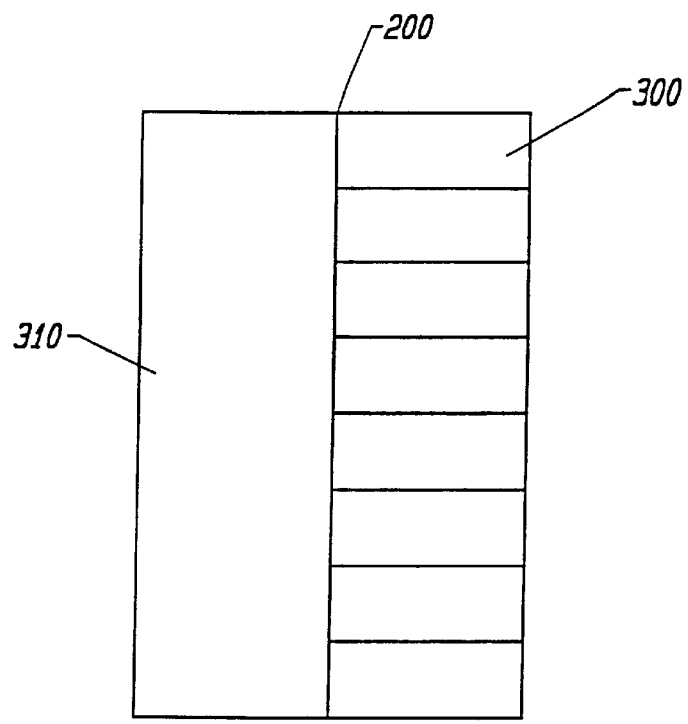
FIG. 3 is a simplified block diagram of a logic array block (LAB) of a programmable logic device.

FIG. 3 shows a simplified block diagram of LAB 200 of FIGS. 2A–D. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight. In a further embodiment of the present invention, LAB 200 has two "banks" of eight LEs for a total of sixteen LEs, where each bank has separate inputs, outputs, control signals, and carry chains.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310, although LE 300 may be implemented in many architectures other than those shown in FIGS. 1–3. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220. Through local interconnect structure 310 and local feedback, LEs 300 are programmably connectable to form larger, more complex logical functions than can be realized using a single LE 300. Furthermore, because of its reduced size and shorter length, local interconnect structure 310 has reduced parasitics compared to the global interconnection structure. Consequently, local interconnect structure 310 generally allows signals to propagate faster than through the global interconnect structure.

Figure 4:
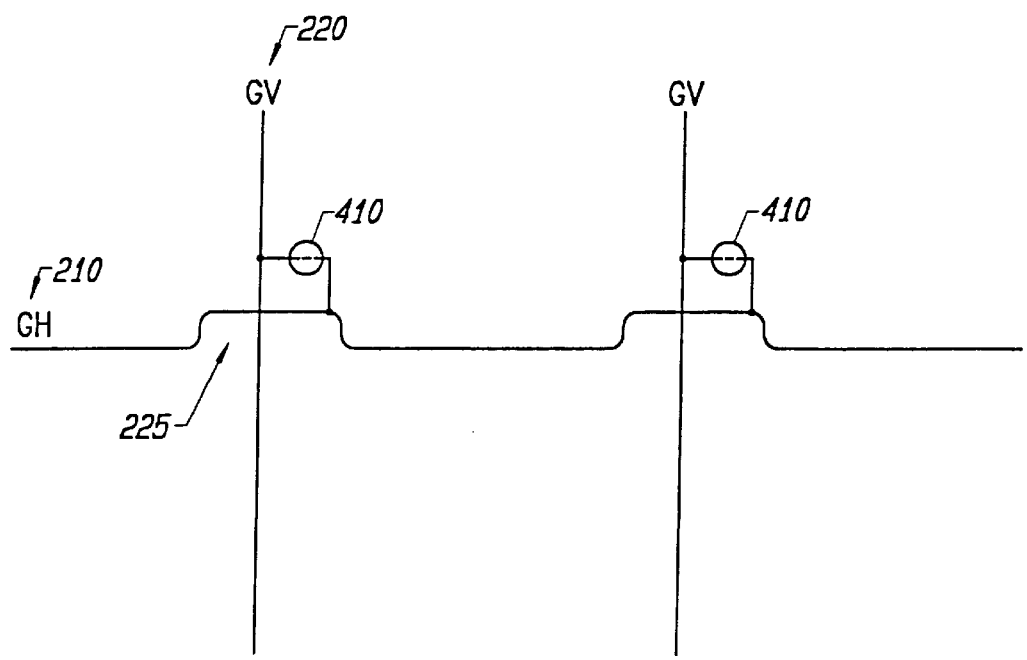
FIG. 4 is a diagram of the programmable interconnect junction cell of the present invention used to implement the programmable interconnect of a programmable logic device.

The programmable interconnect of the present invention may be used in various places in a PLD. For example, the programmable junctions may be used to implement and store the configuration of a look-up table, function generator, AND-OR array, product terms, programmable interconnect, and many other components of the PLD. FIG. 4 is a diagram showing an example of how the present invention may be used in implementing the programmable interconnection resources of a PLD such as shown in FIGS. 2A–D.

In FIG. 4, GH 210 and GV 220 conductors cross at intersections 225. Intersections 225 are sometimes referred to as crosspoints. As is typically the case with global programmable interconnect, GH 210 and GV 220 lines do not connect at intersections 225 unless they are programmably coupled. In the present invention, a programmable interconnect junction 410 is used for programmably coupling GH 210 to GV 220, and vice versa. Programmable interconnect junction 410 may be programmed or configured to couple the GH 210 and GV 220 conductors together. Alternatively, programmable interconnect junction 410 may be programmed or configured to decouple the GH 210 and GV 220 conductors.

In a preferred embodiment, programmable interconnect junction 410 is reprogrammable, which means that the cell may be programmed many times with new data. Furthermore, programmable interconnect junction 410 may be nonvolatile, which means that the stored information is retained even when power is removed. For example, after programmable interconnect 410 is programmed to couple GH 210 to GV 220, the GH and GV conductors will remain coupled indefinitely until programmable interconnect 410 is reprogrammed.

Moreover, the present invention allows the passage of full-rail voltages between GH 210 and GV 220 conductors. For example, a component may drive VCC (or VDD), VSS, or an intermediate value between VCC and VSS from GH 210 onto GV 220. This improves the performance of the interconnect structure because components (e.g., logic blocks and logic elements) and signal lines may be driven by a stronger signal. Also, this minimizes the impact of resistances, capacitances, and other parasitics.

Figure 5:
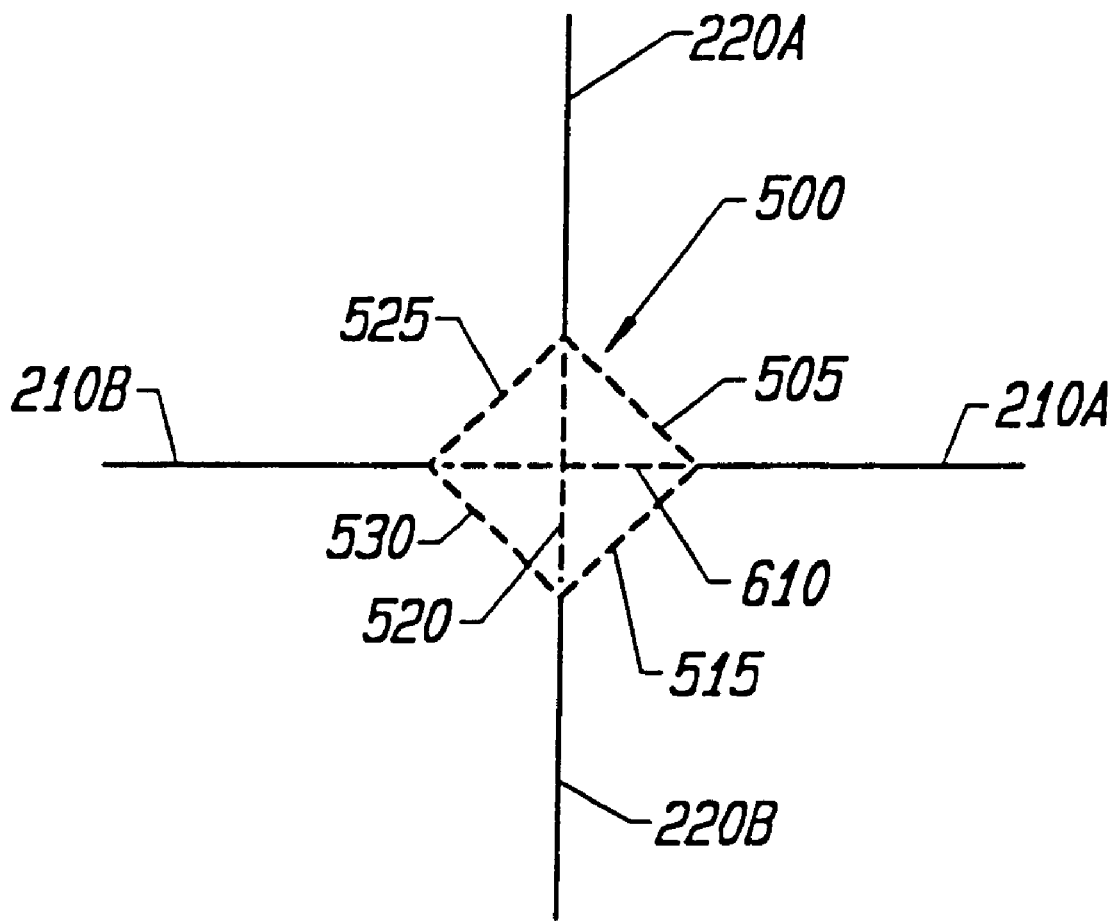
FIG. 5 is a block diagram of a multi-way programmable interconnect junction of the present invention.

FIG. 5 shows an alternative interconnection scheme at a programmable intersection 500. Intersection 500 may be an intersection between GVs and GHs similar to that described earlier. However, intersection 500 allows more flexible routing of the GVs and GHs. Intersection 500 may be referred to as a programmable switch matrix. More specifically, the switch matrix in FIG. 5 is a six-way interconnection matrix since six interconnect paths are provided. Other interconnection matrices are possible. For example, there are one-way, two-way, three-way, and four-way switch matrices, as well as many others. Interconnections matrices may also be used to couple parallel lines of conductors, which would be useful in bus applications.

Specifically, in FIG. 5, GH 210A, GH 210B, GV 220A, and GV 220B are conductors which "intersect" at intersection 500. There may be a plurality of intersections 500 in a integrated circuit. As discussed earlier, GH 210A, GH 210B, GV 220A, and GV 220B conductors may represent global interconnection resources in a programmable integrated circuit.

GH 210A, GH 210B, GV 220A, and GV 220B conductors are programmably connectable to another via indicated dashed-line connections. The dashed-line connections are implemented using a programmable interconnect junction of the present invention. More specifically, GH 210A is programmably connectable to GV 220A using a programmable junction 505, GH 210B using a programmable junction 510, and GV 220B using a programmable junction 515. GV 220A is programmably connectable to GV 220B using a programmable junction 520 and GH 210B using a programmable junction 525. GH 210B is programmably connectable to GV 220B using a programmable junction 530.

These programmable connections may be bidirectional and signals can travel in both direction. For example, a signal can be passed along programmable junction 505 from GH 210A to GV 220A and from GV 220A to GH 210A. In specific embodiments, the programmable junctions may be directional. And, the programmable junction may be buffered, allowing a signal to drive longer distances.

Multiple interconnections may be made at intersection 500. There are many different possible combinations of interconnections. For example, GH 210A may be coupled to GV 220A and GV 220B at the same time. GH 210A may be coupled to GV 220A while GH 210B may be coupled GV 220B at the same time.

Therefore, programmable interconnect junctions of the present invention may be used in the implementation of global interconnect, local interconnect, programmable interconnect arrays, logic elements, function generators, lookup tables, multiplexers, product terms, AND-OR arrays, and other programmable logic circuits. Moreover, the programmable interconnect junction of the present invention may be used in many other types of circuits. For example, in an ASIC such as a gate array or standard cell device, programmable junctions may allow various circuitry options to be implemented, without needing to generate new or additional masks. As a further example, a high-speed version and a low-power version of the same integrated circuit (e.g., microprocessor, multimedia processor, graphics processor, telecommunications switches, memory) may be created from the same chip simply by rerouting the interconnections. A programmable junction chip may be used for in-system rerouting of signals on a printed circuit board or in a switching network system.

As can be appreciated, the programmable interconnect of the present invention may be used in a multitude of applications. Programmable interconnect junctions will shorten the integrated circuit design cycle, lower integrated circuit cost, improve integrated circuit performance, and allow greater integrated circuit functionality. The programmable interconnect junction further contributes to the evolution and advancement in electronics technology, and permits the creation of new types of circuits made possible by the present invention.

Figure 6A:
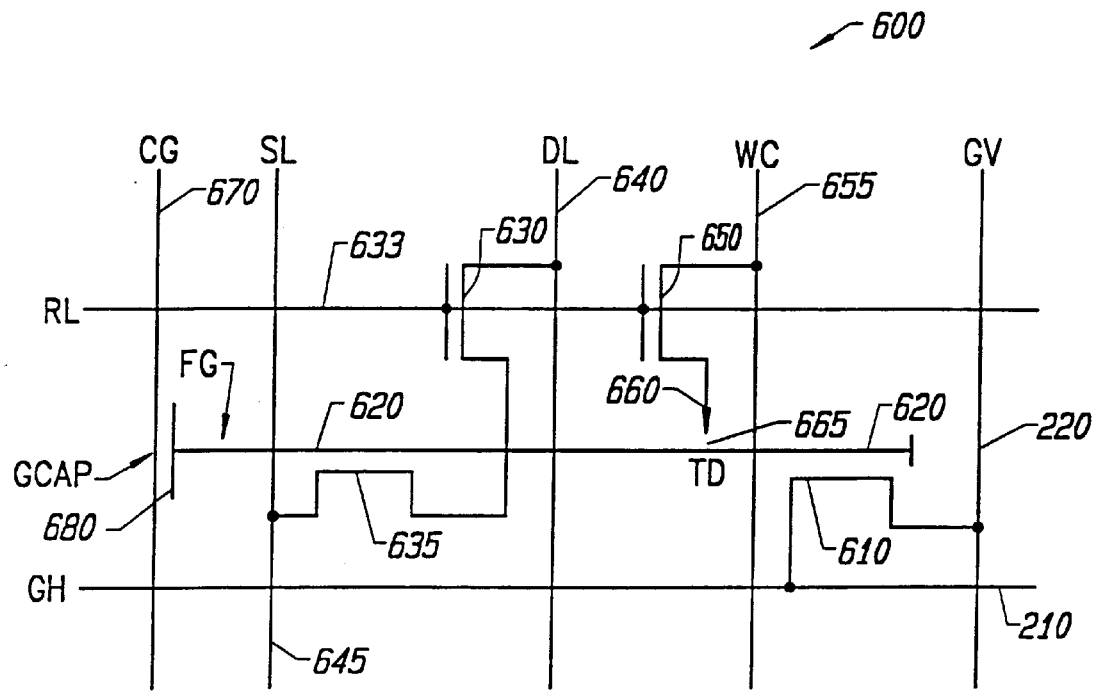
FIG. 6A shows a programmable interconnect junction cell of the present invention.

FIG. 6A shows a specific embodiment of a programmable junction (or switch) cell 600 of the present invention. FIG. 6A shows a single cell design; however, an integrated circuit design may typically contain many programmable junctions similar to the one shown. For example, six programmable junction cells would be used to implement the basic six-way switch matrix shown in FIG. 5. Programmable junction cells 600 may also be used to implement programmable interconnect junctions 410 in FIG. 4.

Programmable switch 600 includes an interconnect element 610 for programmably coupling a GH conductor 210 to a GV conductor 220. GH 210 and GV 220 are conductors that may be used to implement, for example, a global programmable interconnect structure, local programmable interconnect structure, dedicated interconnect lines, and many others. A floating gate 620 programmably controls interconnect element 610. In a preferred embodiment, programmable switch 600 is formed on a p-type substrate material. Interconnect element 610 is an NMOS transistor where floating gate 620 is a gate of the NMOS transistor. Floating gate 620 is polysilicon. Via floating gate 620, interconnect element 610 is configured to either couple or decouple GH 210 and GV 220.

A read device 630 is coupled to permit evaluation of a programming margin of floating gate 620. A gate of read device 630 is coupled to a row line (RL) 633. Read device 630 may be an NMOS transistor. Read device 630 and a program device (or memory device) 635 are serially coupled between a drain line (DL) 640 and a source line (SL) 645. Floating gate 620 is a gate of program device 635. In a preferred embodiment, program device 635 is a memory transistor, and more specifically, an EEPROM or Flash memory transistor. However, the memory transistor may be fabricated using many other technologies.

A write device 650 is coupled between a write control (WC) line 655 and a tunnel diode (or TD node) 660. Write device 650 may be an NMOS transistor. Tunnel diode 660 may be an n-type diffusion region, and may comprise one or more separate diffusion regions. For example, separate diffusion regions may be coupled together via a conductor. A gate of write device 650 is coupled to row line (RL) 633. Write device 650 is used to selectively couple voltages from WC 655 to tunnel diode 660.

Tunnel diode 660 is coupled to transfer electrons to and from floating gate 620. Tunnel diode 660 may transfer electrons through a tunnel dielectric 665 to floating gate 620. Tunnel dielectric 665 is a thin dielectric oxide facilitating the transfer of electrons. A control gate line 670 is coupled through a control gate capacitor 680 to floating gate 620.

The operation of programmable junction 600 is conceptually analogous to an EEPROM or Flash EEPROM memory cell. Existing techniques may easily be adapted to use programmable junction 600, making it easy to incorporate the present invention into existing products, as well as new integrated circuits. Moreover, the present invention shares many similar physical characteristics with an EEPROM or Flash EEPROM memory cell. As a result, the present invention may be fabricated using existing EEPROM or Flash process technologies. Technology advances and experience in EEPROM and Flash EEPROM memories may be easily applied to improve and enhance the manufacturability, operation, and performance of present invention.

In operation, programmable junction 600 stores a configured state via floating gate 620. Programmable junction 600 has two states: programmed and erased (not programmed). Depending on the memory technology used, the terms "programmed" and "erased" may have different meanings. In this specification, the IEEE convention for these terms is used. Specifically, "programmed" refers to placing a switch into an "off" or nonconducting state, and "erased" refers to placing a junction into an "on" or conducting state.

Essentially, the programmable junction in FIG. 6A is configured by programming or erasing program device 635 and interconnect element 610. More specifically, programmable interconnect junction 600 is configured by placing or removing charge from floating gate 620. Depending on a state of floating gate 620, interconnect element 610 decouples or couples GH 210 and GV 220. In other words, interconnect element 610 and program device 635 are programmed or erased to off or on states, respectively. Since floating gate 620 is coupled with interconnect element 610 and program device 635, these devices are in similar programming states at the same time. For example, when interconnect element 620 is programmed, so will program device 635, and vice versa.

In a first state of the programmable interconnect junction, interconnect element 610 and program device 635 are in a programmed state; interconnect element 610 effectively decouples GH 210 and GV 220. In a second state of the programmable interconnect junction, interconnect element 610 and program device 635 are in an erased state; interconnect element 610 effectively couples GH 210 and GV 220. More details on configuring the programmable junction are discussed below.

In the present invention, a sense amplifier for detecting the state of a memory cell during normal operation is not needed. In implementations of programmable interconnect where memory cells are used to store the configuration of the interconnect, a sense amplifier, resistor, pull-up device, or other means are used to determine the memory cell's state. However, as shown in FIG. 6A, floating gate 620 controls interconnect element 610 directly, thereby eliminating the need for memory detection circuity. This conserves silicon area and resources, and effectively increases the packing density of an integrated circuit.

Furthermore, the programmable junction of the present invention maintains its configured state without consuming power. No sense amplifier or other similar memory detection scheme is necessary during normal operation, which would also typically consume power. In a preferred embodiment, the programmable junction consumes zero power.

As the case with EEPROM or Flash technology, the present invention includes a floating gate providing for nonvolatility and reprogrammability. To program and erase the programmable junction, high voltages may be used to transfer charge to and remove charge from the floating gate through an oxide dielectric (e.g., gate oxide) by various physical mechanisms such as avalanche injection, channel injection, direct quantum-mechanical tunneling, Fowler-Nordheim tunneling, hot electrons, and other phenomena.

A high voltage (VPP) used to program the programmable junction may be somewhat different from a high voltage (VEE) used to erase the programmable junction. The magnitude of VPP and VEE depends on the physical characteristics of the programmable junction including such considerations as the thickness and composition of the dielectric between the substrate and the floating gate. Typically, VPP and VEE voltages are in the range of approximately 12 volts to 14 volts. However, as process technology continues to improve, it will become possible to fabricate thinner and better gate oxide dielectrics. Consequently, the high voltages needed to program and erase the programmable junction may decrease in magnitude. These high voltages may be generated by on-chip by circuits such as charge pumps or voltage generators; or provided from sources external to the integrated circuit.

The programmable junction is erased and programmed like EEPROM and Flash cells. To erase the programmable junction, charge is electrically removed from the floating gate using high voltages and quantum-mechanical tunneling. After erasure, the programmable junction, like nonvolatile and programmable EEPROM and Flash EEPROM memory cells, may be reprogrammed. Flash EEPROM cells are generally programmed using hot electrons, while EEPROM cells are programmed using quantum-mechanical tunneling. In some cases, Flash EEPROM cells are programmed using quantum-mechanical tunneling. EEPROM and Flash cells may be programmed, erased, and reprogrammed many times for the lifetime of the device.

When the programmable junction is programmed, charge is placed on a floating gate and in so doing, that interconnect element 610 and program device 635 are placed in a high threshold voltage state (VTP or high VT). The floating gate retains this charged state indefinitely, even when power is not supplied to the programmable junction; this provides nonvolatility. In the programmed or high VT state, a reasonable voltage on control gate 670 will not turn on interconnect element 610 and program device 635.

A reasonable voltage may be, for example, a voltage between the supply voltages of the integrated circuit, VDD and VSS; at that voltage, interconnect element 610 and program device 635 will not conduct. A reasonable voltage may also be greater than VDD. However, in the case when a voltage above VTP is placed on control gate 670, the interconnect element 610 and program device 635 may turn on. For EEPROM and Flash EEPROM technology, the typical threshold voltage for a memory cell in a high VT state is, for example, approximately 6 volts. Moreover, when programmed using an "assist" technique (described below), the high VT state may be somewhat higher then 6 volts. For example, with control gate 670 at 2 volts, in the high VT state, interconnect element 610 will be nonconducting or off. Interconnect element 610 decouples GH 210 and GV 220.

When erasing the programmable interconnect junction, charge is removed from the floating gate and interconnect element 610 and program device 635 are placed in a low VT state (VTE). The floating gate retains this erased state for the life of the memory cell, even when power is not supplied. In the erased or low VT state, a reasonable voltage on a gate of the memory cell will turn the memory cell on. Interconnect element 610 is conducting (or on) and couples GH 210 and GV 220 together. For Flash EEPROM technology the typical threshold voltage for a low VT state ranges from approximately 0.5 volts to 2 volts. For EEPROM technology, this may range from approximately −3 volts to −1 volt.

When erasing using a "smart" algorithm, a specific low VT voltage level state may be achieved. For example, the VTE may be about −1 volts. In another example, the VTE may be zero volts or slightly above zero volts. A smart algorithm removes charges from the floating gate using an iterative technique, removing small amounts of charge until a desired VTE is achieved. A smart algorithm may be used to prevent a negative VTE, especially important in some applications where a negative VTE is undesirable such as for high-density, high-capacity Flash EEPROM memories. In other applications such as programmable logic devices, a negative low VT state may be allowable. For example, a negative VTE may be desirable in order to permit interconnect element 610 to pass approximately full-rail voltages (e.g., VCC or VDD) between GH 210 and GV 220. In this case, interconnection device 610 would be analogous to an NMOS depletion device.

Typically, arrays of programmable cells are "initialized" to a particular first state, and then they are configured by changing selected cells to a second state. The initiation state of an array is chosen based on many considerations including the process technology selected to fabricate the cells and the intended use of the cells, as well as the interconnections within an array. For example, Flash EEPROM cells are typically initialized by bulk erasing the cells to a low VT state. In contrast, an array of EEPROM cells is typically initialized by bulk programming the cells to a high VT state.

Control gate 670 activates interconnect element 610 and program device 635. During normal operation, the control gate is coupled to a voltage level which activates and enables operation of the programmable junction. Until activated, interconnect element 610 is in a nonconducting state (i.e., GH 210 and GV 220 will be decoupled under at least some conditions of normal operation). To activate interconnect element 610, the control gate is coupled to a voltage level which is greater than VTE and less than the VTP. The voltage at the control gate may also be used to center a window of operation of the interconnect element. For example, for typical EEPROM technology, a control gate voltage should be above about 1 volts (VTE) and less than about 5 volts (VTP). The control gate may be coupled to a switching signal line, which provides voltages between VSS and VDD. The control gate voltage may also be above VDD. This may be used to improve performance of the interconnect element.

In a preferred embodiment of the present invention, to provide the greatest amount of programming and erase margin, the control gate voltage is selected to be at approximately the center of VTE and VTP. For example, for EEPROM technology, the control gate voltage is set in the range from about 1.7 volts to about 2 volts. An activation voltage above VDD may also be used because among other reasons, this may be required by the memory element, or a higher voltage level is readily available. Also, this voltage level may center the window of operation of the interconnect element. The control gate is also used during the programming of the memory cell, which is described in more detail below.

When utilizing EEPROM and Flash EEPROM technologies, the programmable junction of the present invention is erased using Fowler-Nordheim tunneling. For Flash operation, the programmable junction is initialized to an erased state. To initialize interconnect element 610 and program device 635 to a low VT state, VEE+VTN (a threshold voltage of write device 650) is placed on row line 633. VEE is placed at WC line 655. As discussed earlier, VEE is a high voltage used for erasing the devices. VEE is typically in the range of 12 volts to 14 volts. Control gate 670 is held at a low voltage, grounded or negative. When erasing, a negative assist programming technique may be used by placing a negative assist voltage on the control gate. For example, a voltage of −3 volts may be placed on control gate 670. This would decrease VTE, improving the erase margin of interconnect element 610 and program device 635.

DL 640 and SL 645 are grounded. VEE is passed through write device 650 to tunnel diode 660. Typically, one or more tunnel dielectrics 665 are positioned above tunnel diode 660.

In operation, from tunnel diode 660, electrons may tunnel, in both directions, through the tunnel dielectric via quantum-mechanical tunneling to and from floating gate 620. High voltage VEE at tunnel diode 660 attracts electrons from the floating gate 620 via Fowler-Nordheim tunneling. This makes floating gate 620 more positively charged, and places interconnect element 610 and program device 635 in a low VT state. The VTE may be approximately −2 volts.

The time to erase the devices is typically about one hundred milliseconds. However, the erase time may be less than one hundred milliseconds, and may also be very much greater than one hundred milliseconds. A lower minimum erase time is desirable to speed-up the rate at which an array of programmable junctions may be erased.

Using Flash technology, programmable junctions in an array of such devices are selectively programmed. To program the programmable junction, interconnect element 610 and program device 635 are programmed to a high VT state. VPP is placed on control gate 670. As discussed earlier, VPP is a high voltage used for programming the memory cells. VPP is typically in the range of about 11 volts to about 14 volts. This voltage also depends on the technology used, and may be lower such as 10 volts. A VPD voltage is placed on SL 645. VPD is selected to optimize the efficient programming of the devices. These considerations include ensuring that interconnect element 610 and program device 635 are programmed well, minimizing any destructive effects on the devices, and observing the current density constraints of the power conductors. In one embodiment, VPD is about 8 volts. However, VPD may be in the range from about 5 volts to about 11 volts. Row line 633 is set at a voltage sufficient to turn read device 630 on: This voltage should be sufficiently high to permit read device 630 to pass a programming current. For example, this voltage may be VPP or even higher. WC 655 and DL 640 are grounded. GH 210 and GV 220 are floating.

Under these conditions, tunnel diode 660 is grounded; a significant current flows from SL 645 through program device 635 and read device 630 to DL 640. For example, this current may be about five hundred microamps, or more. The current may be in the range from five hundred microamps to seven hundred microamps. This current generates hot electrons, some of which jump a dielectric barrier (i.e., gate oxide or thin oxide) and become trapped in floating gate 620. Floating gate 620 becomes negatively charged. Interconnect element 610 and program device 635 are programmed to a high VT state. VTP is typically about 5 volts or greater.

In the above example, the programming current was generated in a direction from SL 645 to DL 640. However, the programmable junction may also be programmed by similarly inducing a programming current from DL 640 to SL 645. In this particular case, VPD will be placed at DL 640 and SL 645 is grounded. Although both techniques described may be used to program an array of programmable junctions, there are some advantages and disadvantages to these techniques.

In particular, in the case when DL 640 is grounded during programming (i.e., programming current flows from SL 645 to DL 640), there will be no body bias on read device 630. Consequently, for a given voltage on row line 633, the relative impedance of read device 630 will be minimized, compared to that for program device 635. Consequently, a larger proportion of the VPD voltage (across SL 645 and DL 640) will be dropped across program device 635 compared to the case when SL 645 is grounded (i.e., programming current flows from DL 640 to SL 645). Therefore, in this case, VPD may be a lower voltage than in the case when SL 645 is grounded and still allow proper programming. A reduced VPD voltage also means reduced stress on circuitry and devices which are exposed to VPD or a portion of VPD. For example, in this case, VPD would be about 8 volts.

On the other hand, in the case when SL 645 is grounded during programming (i.e., programming current flows from DL 640 to SL 645), there will be no body bias on program device 635. For a given VTP, the necessary VPP voltage will be lower than in the case when DL 640 is grounded. One reason is that there is an increased voltage coupling between CG 670 to SL 645 when compared to the other case, where a corresponding voltage would be coupled between CG 670 and an internal node between read device 630 and program device 635. Under the conditions when DL 640 is grounded, the voltage at the internal node will likely be above zero volts. Because of the larger voltage being coupled across the floating gate in the grounded SL 645 case, a lower VPP voltage may be used for programming. And, a lower VPP voltage also means reduced stress on circuitry and devices which are exposed to VPP or a portion of VPP.

As discussed previously, an increased VPD is needed because of the body bias on read device 630. For example, in this case VPD may be about 10 volts. However, this body bias effect is useful for minimizing possible hot electron disturb effects, so that unaccessed cells in an array of cells are not disturbed or altered. For example, among other reasons, because of the body bias effect, it will be easier (and faster) to turn off read device 630, which tends to block some disturb effects.

Figure 7:
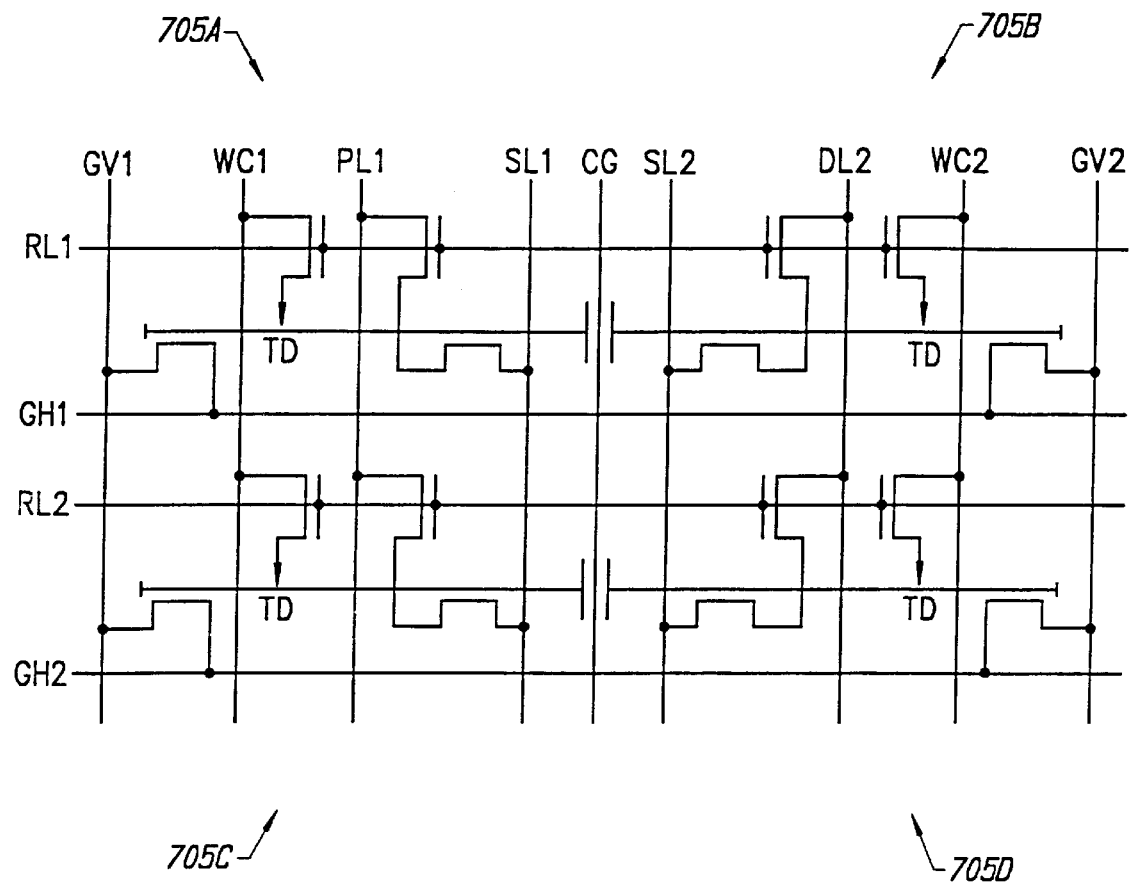
FIG. 7 shows an array of programmable interconnect junction cells of the present invention.

It is an important consideration when programming selected programmable junctions in an array of programmable junctions (such as shown in FIG. 7) to avoid altering or disturbing the programmed or erased state of the unselected programmed junctions. It is desirable that the unselected programmable cells remain in their programmed or erased state.

A potential problem is that the voltages and conditions used to induce the programming current for programming a programmable junction by hot electron programming may disturb other programmable junctions (possibly in the same or adjacent row or column). For example, this voltage may program unselected programmable junctions by Fowler-Nordheim tunneling. A technique of minimizing this disturb phenomenon is to fabricate the programmable junction with a thicker tunnel oxide. This increases the voltage necessary to possibly disturb the devices by Fowler-Nordheim tunneling.

Another technique is to minimize the potential for disturb conditions by using an appropriate programming approach. For example, during programming, the selected row line 633 may be coupled to about VPP, while unselected row lines 633 are coupled to an intermediate voltage. For programmable junctions in the same column as the selected programmable junction, DL 640 may be at VPD (e.g., about 10 volts) while SL 645 is grounded. By setting the unselected row lines 633 at an intermediate voltage of about 3 volts, the voltage across (and current through) program device 635 of the unselected programmable junctions is not sufficient to permit hot electron programming. Further, WC 655 is set at about 2 volts, which is coupled through write device 650 to tunnel diode 660. Consequently, with a VPP of about 11 volts, the unselected programmable junctions will not be disturbed by Fowler-Nordheim tunneling. For other columns with unselected programmable junctions, SLs 645 and DLs 640 may be floated to avoid the disturb conditions and prevent any parasitic current flow.

Parasitic or leakage current flow is generally not large enough to disturb the memory cells. Yet, parasitic current flow is undesirable as too high a leakage reduces the available current for programming. This may adversely affect the degree to which the memory cells are programmed, or negatively impact die size since additional circuitry may be necessary to compensate for the losses due to the parasite current.

The specific example given above is but one technique which may be used for programming selected programmable memory cells implemented using Flash technology. Other voltages and techniques may also used.

For EEPROM operation, the programmable junction is programmed and erased using Fowler-Nordheim tunneling. This may be referred to as full $E^2$ operation. The programmable junction is initialized by programming or bulk programming (for an array of cells) to a high VT state. Control gate 670 is coupled to VPP. DL 640, SL 645, and WC 655 are grounded. Row line 633 is placed at a voltage sufficient to turn write device 650 on, which is about 2 volts or above. Electrons tunnel from tunnel diode 665, which is grounded, through tunnel dielectric 665 to floating gate 620. As a result, interconnect element 610 and program device 635 are programmed to the high VT state. VTP is typically about 5 volts.

VTP may be boosted to a higher value by using an "assist" programming technique. In assist programming, when programming a programmable junction, for example, SL 645 is set at VDD. Since control gate 670 is VPP, the other terminal of program device 635 is also at about VDD. Under these conditions, more electrons become trapped in the floating gate than under the programming conditions described previously. Hence, the floating gate is programmed to a higher VTP.

Furthermore, this assist voltage may be any voltage above ground. For example, VDD may be used since this voltage is readily available. However, voltages above VDD, such as VPP, may also be used. Generally, the higher the assist voltage, the greater the boost in VTP. In the case of programmable junction 600 of FIG. 6A, in addition to SL 645, the assist voltage may also be coupled to GV 200 or GH 210, or both. The assist voltage may be applied to these lines (i.e., SL, GV, GH) individually, or in combination. An assist voltage may also be coupled to DL 640, provided that the voltage at RL 633 is sufficient to pass this voltage to program device 635.

For EEPROM operation, programmable junctions in an array are selectively erased to a low VT state. The erase operation is similar to that described for Flash operation above. Specifically, control gate 670 is grounded or placed at a negative voltage (for negative assist programming as discussed above). WC 655 is coupled to VEE. In order to pass VEE to tunnel diode 620, row line 633 is coupled to VEE+VT or above. DL 640 and SL 645 may be floating or grounded. Electrons will tunnel from floating gate 620 through tunnel dielectric 665 to tunnel diode 660. Interconnect element 610 and program device 635 are erased to a low VT state.

The programmable junction of the present invention provides a margin testing feature. During the fabrication and production of the programmable junction, it is desirable to test and verify the programming and erase margins of the programmable junction cells. Programming and erase margin are the degree to which a cell when in one state (i.e., programmed or erased), may be differentiated from the other state. If there isn't sufficient programming margin, then the circuitry may be unstable; for example, a cell will only sometimes be in the desired or configured state depending on temperature and voltage conditions. Or, the circuitry may completely fail functionally. For example, when exercising a configured programmable junction, this programmable junction will not function as desired, causing logical errors. Hence, margin testing is important for ensuring the reliability and integrity of the circuitry on the integrated circuit.

A method of margin testing a programmable junction cell such as shown in FIG. 6A involves the following steps. During testing, program device 635 is utilized. Margin testing generally does not involve interconnect element 610 since this component is coupled to the signal path of the integrated circuit. It is uncertain how other components may be coupled to programmable junction cell 600 through GH 210 and GV 220. Many problems could potentially arise. For example, testing of margin using interconnect element 610 could possibly damage other components coupled to GH 210 and GV 220. Furthermore, additional circuitry may need to be coupled to GH 210 and GV 220 in order to test margin using interconnect element 610. This additional circuitry would unduly impact speed path performance due to increased loading, as well as other similar considerations.

Determining a margin of program device 635 will also accurately reflect a margin of interconnect element 610 because these two devices are controlled by the same floating gate 620. A charged state of floating gate 620 will affect program device 635 and interconnect element 610 similarly. Therefore, in a preferred embodiment of the present invention, margin is evaluated using program device 635 which minimizes the impact on interconnect element 610. Furthermore, the programmable junction shown in FIG. 6A allows margin testing of individual cells, even when many cells are coupled together in an array.

To margin test, a programmable junction cell to be tested is selected. Erase and program margin are evaluated similarly. For erase margin, the programmable junction cell is initially in an erased state. For program margin, the programmable junction is initially in a programmed state. WC 655 is grounded. DL 640 is set to about 2 volts. SL 645 is grounded. Row line 633 is used to select a program device 635 for testing and verification. For example, in an array, multiple cells may be coupled to the same DL 640 and SL 645 lines. A row line 633 corresponding to the programmable junction cell to be tested is set at a voltage to turn on read device 630, which may be approximately 2 volts. Other row lines for cells coupled to the same DL are set at a voltage to turn off the read device; this voltage may be about ground, or more specifically, below a threshold voltage of the read device.

A voltage supplied at control gate 670 is swept until program device 635 begins to conduct. This voltage is an indication of the programming margin of the interconnect element 610, and in particular, margin for when current flows in a first direction from DL 640 to SL 645. In cases when margin testing erased cells with a VTE of zero volts or below, these cells will conduct even when the control gate is set at zero volts. In such a case (and negative voltages are unavailable or undesirable for coupling to the control gate 670), the conduction with a control gate voltage of zero volts may be used as an upper bound on VTE. Also, the magnitude of the conduction may be used to estimate the VTE in some cases. Margin may also be evaluated for current flow in a second direction, SL 645 to DL 640. The margin may be different under these dissimilar conditions; margin may be evaluated under both conditions to find the minimum value. To test margin for the SL 645 to DL 640 direction, the testing conditions are similar to those described above, except SL 645 is coupled to about 2 volts, and DL 640 is grounded. Control gate 670 is swept until program device 635 begins to conduct. This voltage will be an indication of margin for interconnect element 610 for the second direction.

During normal or functional operation of the programmable interconnect junction of FIG. 6A, interconnect element 610 connects or disconnects GH 210 and GV 220 depending how the cell was configured. The read device 630 and program device 635 are not used. Hence, the read device and program device may be optional in a programmable interconnect junction of the present invention. The read device and program device, either or both, may be omitted from the programmable interconnect junction of FIG. 6A, without affecting the functional operation.

When using EEPROM and Flash EEPROM technology, the programmable junction cell has a finite, but relatively long service life. Several factors affect the service life or longevity of the programmable junction cell of the present invention. A consideration for extending the longevity of the programmable junction cell is to reduce an electric field between the channel and the substrate of interconnect element 610 (and program device 635). Specifically, when a floating gate memory cell (e.g., EEPROM or Flash EEPROM) is used, longevity is increased when floating gate 620 is not subjected to a channel-to-substrate bias (referred to as floating gate disturb phenomena). A channel-to-substrate bias generates electron-hole pairs. These electrons are attracted to the floating gate, which may disturb the memory cell and reduce the lifetime of the device.

Therefore, to increase device longevity, in normal operation, when program device 635 is not used, for example, the channel of the program device may be set to ground (or another relatively low voltage) by coupling SL 645 to ground and turning off read device 630 (e.g., ground RL 633). This would tend to reduce the channel-to-substrate bias and increase the lifetime of the device.

Another technique would involve limiting the VDD (or VCC) of the integrated circuit. The present invention passes full-rail voltages between GH 210 and GV 220. On an integrated circuit, the channels for at least some interconnect elements 610 will be at about VDD. Therefore, to minimize the channel-to-substrate bias, VDD should be kept at a minimum level. For example, VDD at 3.3 volts (or 3.6 volts) would provide greater device longevity than VDD at 5 volts. Another technique involves reducing the internal VDD (or providing a local VDD) less than a voltage at a VCC pin. Furthermore, lower VDD supply voltages are becoming more prevalent as technology improves. For example, many new products use 3.3-volt supplies, and are replacing many 5-volt supply products. Even lower supply voltages may be used in the future, such as 2.5-volt supplies. Therefore, this reduction in VDD voltages will also improve the longevity of the present invention.

Still another technique would be to have a lower doping in the channel region. This also decreases the channel-to-substrate electric field. For example, program device 635 or interconnect element 610, or both, may be native devices. A native device typically refers to a device (e.g., transistor) which remains undoped during the processing. A native device has a lower threshold voltage (e.g., about zero volts to about 0.4 volts). Therefore, the native device tends to be harder to turn off than a typically doped device. The channel length of the device may need to be increased to ensure the native device can be turned off. This may negatively affect the packing density of the programmable interconnect junction. And, this may negatively impact the performance of the circuitry, resulting from the increased parasitics.

Even if native devices are not used, the doping of program device 635 or interconnect element 610, or both, may be tailored (e.g., graded implant profile) to achieve desired characteristics. For example, the devices, 635 or 610 or both, may be lightly doped. This would provide an increase in device longevity, but without the disadvantages of using native devices as discussed above.

Figure 6B:
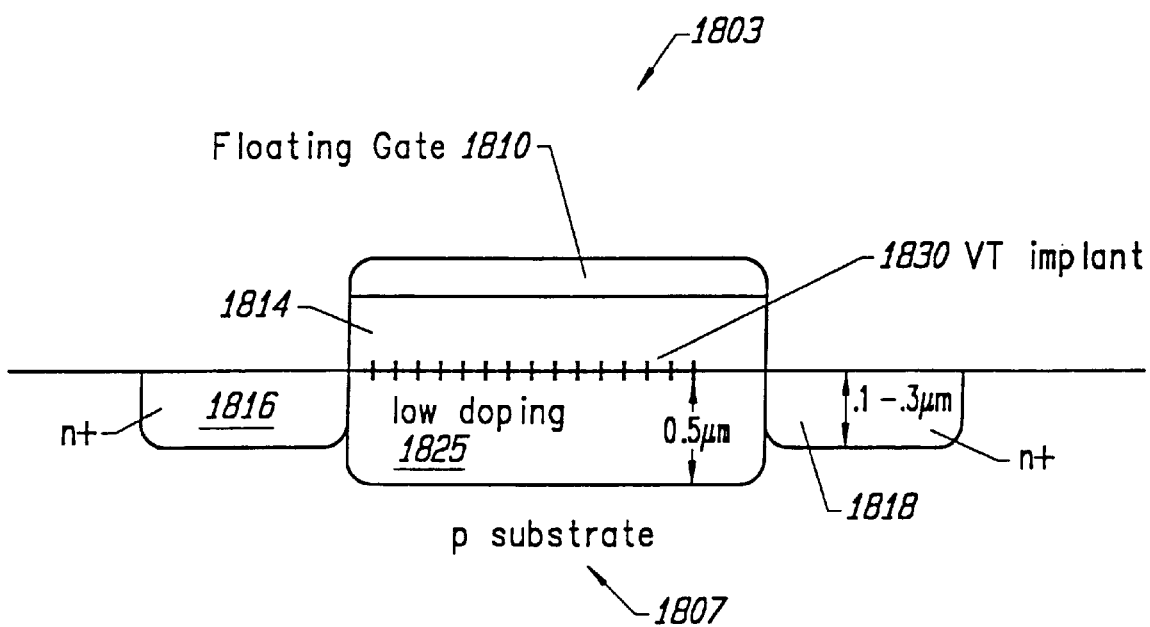
FIG. 6B shows a cross section of a nonvolatile device tailored to avoid substrate hot electrons.

As a further example, FIG. 6B shows a cross section of a device 1803 tailored to avoid substrate hot electrons and thus provide greater device longevity. This transistor may be used as interconnect element 610 in the embodiment of the present invention shown in FIG. 6A, or in other embodiments of the present invention. Further, the techniques described are generally applicable or adapted in order to enhance EEPROM and Flash technology devices.

To reduce hot electron effects which may degrade nonvolatile devices, an especially important factor is having a relatively low electric field and low electron concentration in the top 1000 Angstroms of the device. A low substrate doping leads to a lower electric field, a lower electron concentration (e.g., fewer candidates available for combining and electron-hole pair production), and reduced injection current. Fewer electrons will get swept into the floating gate. Consequently, devices fabricated having this characteristic will generally have a longer service life. Furthermore, the doping profile of FIG. 6B, in which a higher doped region underlies a lower doped region, may suppress minority electrons for available entry into the depletion region. This doping profile may also help prevent punch through and reduce electron concentration at the surface.

A native device may be fabricated using this approach to have a relatively low doping level in the surface region. This native device may be useful to avoid hot electron effects. Further, the native device should also be processed at the same time to have a reasonable threshold voltage.

Further processing may be used to provide possibly even greater benefits. As a specific example, device 1803 in FIG. 6B has improved characteristics for reducing substrate hot electron effects. Device 1803 is formed in a p-type substrate 1807 and has a floating gate 1810 and n+ regions 1816 and 1818 for use as a source and a drain. N+ regions 1816 and 1818 typically have a junction depth of about 0.1 micron to about 0.3 microns. Beneath floating gate 1810 is a gate oxide 1814. A typical thickness of gate oxide 1814 is about 125 Angstroms.

Device 1803 also includes a low doping region 1825. Low doping region 1825 is formed in the substrate below floating gate 1810. A depth of the low doping region may extend below that of the n+ junction. A depth of low doping region 1825 should be selected based on the deepest possible depletion region. This depth may be typically about 0.5 microns. The doping concentration in this region may be about $1 \times 10^{16}$ cm$^{-3}$. A dopant such as boron may be used. In contrast, the substrate at a depth below low doping region 1825 may be about $1 \times 10^{17}$ cm$^{-3}$. Therefore, device 1803 may have a doping step at about 0.5 microns. The doping levels given are not especially critical, but are merely examples. Further, there may be a plurality of doping regions with varying concentrations, instead of the single low doping region 1825 and single step to a higher doping region. For example, there may be two low doping regions set at various depths.

There are many techniques for fabricating the doping profile of the present invention. For example, the technique may involve a plurality of implanting steps. Further, technique may involve heavily doping the substrate and then counter-doping to form the lower doping region near the substrate.

A VT implant 1830 may be used at the surface to adjust the threshold voltage of device 1803. VT implant 1830 may have a doping concentration of approximately $6\times10^{11}$ cm$^{-2}$. VT implant 1830 would be a relatively shallow implant, and would primarily be on the surface of the substrate.

The structure of the present invention may be formed without using a VT implant. In this case, it may be desirable to provide a slightly higher doping concentration in the low doping region 1825 in order to obtain a desired VT. For example, this doping concentration may be $3\times10^{16}$ cm$^{-3}$.

A still further technique to increase device longevity involves minimizing a gate field of the program device 635 or interconnect element 610, or both. For example, one technique is to transfer less charge (e.g., fewer electrons) into floating gate 620. However, this may negatively impact performance because full-rail voltages may not be conducted through interconnect element 610. Also, this may reduce the margin of the program device 635 and interconnect element 610, leading to possible functional errors.

The above techniques are example of ways, which may be used individually or in combination with another, to improve the device longevity, data retention, and reliability characteristics of the present invention.

FIG. 7 shows an array of programmable junction cells 600 of FIG. 6A. An array configuration for programmable junction cells 600 is a technique for compactly arranging the cells on an integrated circuit. Although cells may be laid out together on the integrated circuit, cells may couple to and drive logic and other components in many different locations on the integrated circuit. FIG. 7 shows a simplified layout of an array of four programmable junction cells, 705A–705D. Each programmable junction cell is a programmable junction cell 600 as described above. Larger arrays of junctions may be constructed by mirroring, exploiting circuit symmetry, and other similar techniques, as shown in FIG. 7.

The layout of programmable junctions shown in FIG. 7 saves integrated circuit area. There are a plurality of signal in a first direction and a plurality of signals in a second direction. In this embodiment, the signals in the first direction run substantially transverse to the signals in the second direction. In the first direction, the signals include GV1, WC1, DL1, and SL1 for a first column of cells; and GV2, WC2, DL2, and SL2 for a second column of cells. A common CG line is coupled to the programmable interconnect junctions. In the second direction, the signals include GH1 and RL1 for a first row of cells; and GH2 and RL2 for a second row of cells. These control and interconnect lines are coupled to the corresponding nodes in a programmable junction cell as described above for FIG. 6A. This configuration of signal provides for efficient layout of programmable junction cells, while providing for the programming, erasing, margining and accessing of the cells.

Programming and erasing of junctions in an array is similar to that described above for a single junction. By selectively coupling the appropriate voltages to the appropriate control lines, the desired programmable junction cells will be programmed or erased. During EEPROM operation, the entire array or portions of the array may be bulk programmed. CG lines are coupled to VPP. DL lines (e.g., DL1, DL2), SL lines (e.g., SL1, SL2), and WC lines (e.g., WC1, WC2) are grounded. For example, row lines (e.g., RL1, RL2) are set at a voltage sufficient to enable the write devices to pass ground from the DL lines to the tunnel diodes. Under these conditions, electrons will tunnel from tunnel diodes into the floating gates of the junction cells. The array or portions of the array will be programmed. Assist programming may also be used for an array of memory cells. The assist technique would be analogous to that described above for a single cell.

Programmable junction cells in the array may be selectively erased. For example, CG lines are grounded (or negative). WC lines corresponding to the desired cells to be programmed are placed at VEE, and the corresponding RL lines are set to VEE+VT or above. The desired programmable junctions cells are erased. This operation may proceed row-by-row (or column-by-column) until an entire pattern is imprinted.

The configuration of an array during Flash operation is analogous. Specifically, the array or portions of the array are simultaneously erased in using a technique similar to that described above for a single programmable junction. Selected junctions cells may be programmed by applying the necessary voltages (described above) to the appropriate WC, SL, DL, and RL lines. The array of portions of the array may be imprinted in a row-by-row basis.

Moreover, during Flash operation, the programmable junctions are programmed using hot electrons. As described earlier, hot-electron programming generally requires rather large amounts of current—for example, about five hundred microamps is needed per bit. This generally limits the number of bits that can be programmed at one time because of current density concerns. Therefore, in a preferred embodiment of the present invention, a selected number of cells in the array are programmed at a time. This minimizes the programming current required at one time, thus reducing the likelihood of current density and related problems. By limiting the number of programmable junctions that may be programmed at a time, the total programming current for the integrated circuit may be selectively limited to a desired value. This current may be one milliamp, two milliamps, four milliamps, eight milliamps, or set to any desired value. For example, to limit current draw to about four milliamps, eight programmable junctions may be programmed at one time.

Though the number of junctions that may be programmed at any one time may be limited, the programming of the array may be speeded up by various techniques such as interleaving. Interleaved programming involves programming a first set of programmable junctions while at the same time preparations are made to program a second set of junctions. As soon as the first set of junctions are programmed, the second set is programmed and a third set is prepared. This technique speeds up the programming process since other operations (e.g., preparing to configure a portion of the array) are taking place while a set of cells are being programmed.

In contrast to hot-electron programming, by using Fowler-Nordheim tunneling, substantially less current is needed to program using EEPROM technology. EEPROM cells are programmed primarily due to the magnitude of the high voltages. Electrons are "punched" through a thin dielectric window (e.g., tunnel oxide or tunnel dielectric 665). Since high currents are not necessary, EEPROM operation has an advantage in the design and fabrication of integrated circuits which may be programmed while resident on a system board—in-system programming (ISP)—when large currents are unavailable. Compared to hot-electron programming, greater numbers of programmable junctions may be programmed simultaneously.

Flash technology may also be used for ISP. In this case, fewer programmable junctions may be programmed at a time because of the greater current demands. However, typically, Flash cells may require less programming time than EEPROM cells. Therefore, although limited numbers of cells may be programmed at a time using Flash technology, the overall programming time for an array may be the same or even faster than for EEPROM technology because of the faster programming time per cell.

In a specific embodiment of the present invention, the programmable junctions are programmed using ISP. ISP programming is a technique where the programmable junctions in a programmable integrated circuit are configured (programmed or erased) while resident in the system. Specifically, the programmable integrated circuit need not be removed from the circuit board and configured using an apparatus specially designed for programming such integrated circuits (e.g., Data I/O programmer). ISP programming allows greater flexibility when reprogramming programmable circuits. For example, the configuration information in a programmable circuit may be updated or modified as needed without requiring the removal and installation of components, or disassembly of the system.

An array of programmable junction cells of the present invention may be margin tested as discussed above. A particular cell is selected by turning on the read device for that row, while other read devices coupled to the same DL line remain off. The CG line is swept until the program device begins conducting. This evaluates the margin for a particular programmable junction cell. As discussed previously, in cases where VTE is zero volts or below, and negative voltages are unavailable for coupling to the CG line, there may be conduction when the CG line is grounded. This determination may be used as an upper bound on VTE, or to estimate the VTE. Margin testing of the programmable interconnect junction cells may proceed row-by-row until all the desired cells are evaluated.

Figure 8:
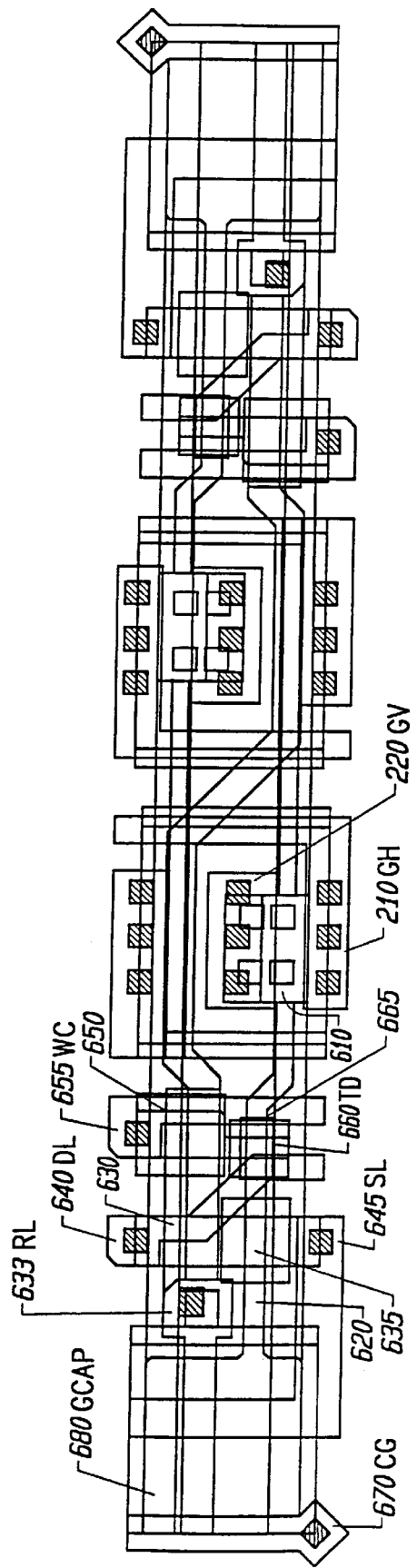
FIG. 8 shows a layout of the programmable interconnect junction cell of the present invention.

FIG. 8 shows a layout of the implementation of the programmable interconnect junction shown in FIG. 6A. FIG. 8 shows two cells which have been mirrored and layed out adjacent to another; this results in a more compact layout. References numerals in FIG. 8 correspond to like reference numerals in FIG. 6A. Floating gate 620 is a polysilicon layer used to form program device 635 and interconnect element 610. Interconnect element 610 is coupled between GH 210 and GV 220. GH 210 is brought out using first metal while GV 220 is coupled to second metal. In this embodiment, the GH 210 conductor runs substantially perpendicular to the GV 220 conductor. Floating gate 620 is also a terminal of control gate capacitor 680. Another terminal of control gate capacitor 680 is CG line 610.

Row line 633 includes a polysilicon layer portion, used to form read device 630 and write device 650. Row line 633 is strapped using first metal to other cells in the same row. Read device 630 is coupled between DL 640 and a drain terminal of program device 635. SL 645, coupled to a source terminal of program device 635, is brought out using first metal. Write device 655 is coupled between WC 655 and tunnel diode 660. Tunnel diode 660 is a diffusion region. Positioned above tunnel diode 660 and floating gate 620 is a tunnel dielectric window 665.

Figure 9:
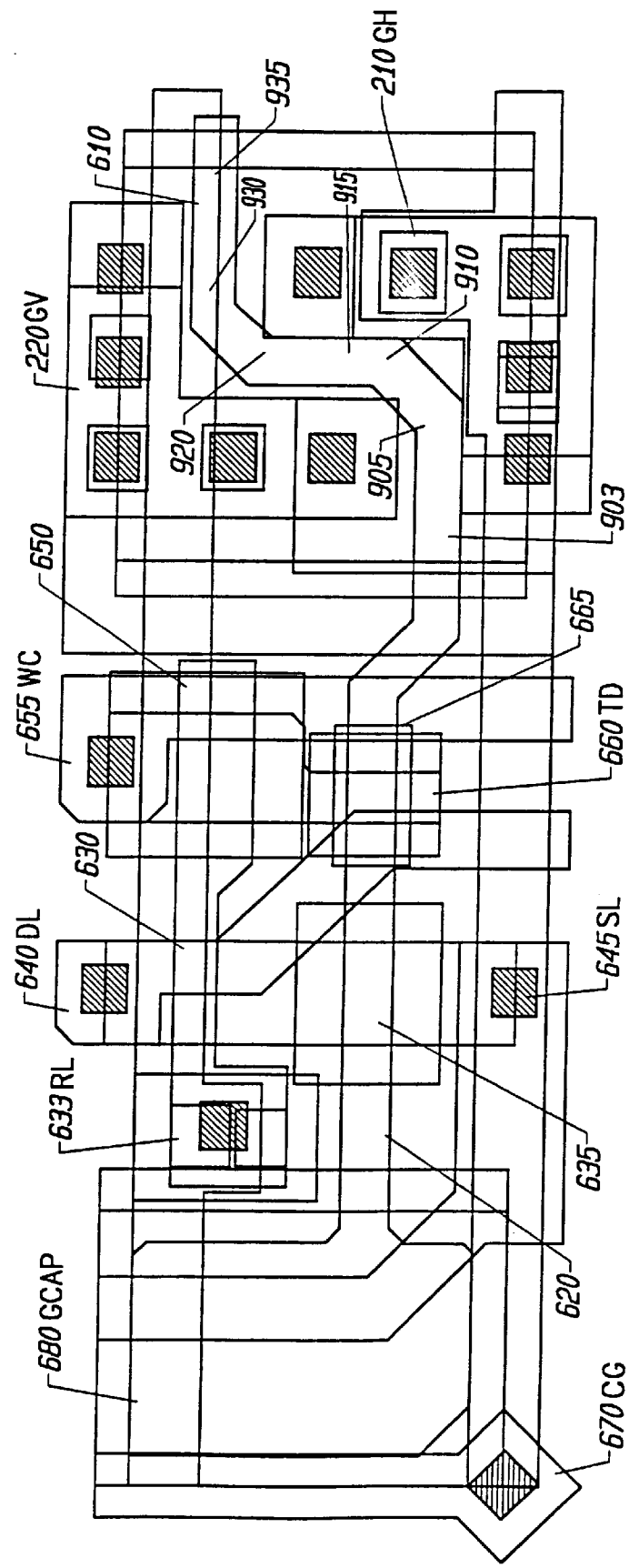
FIG. 9 shows another layout of the programmable interconnect junction cell of the present invention.

FIG. 9 illustrates a further example of a layout of the programmable junction of FIG. 6A. This layout is similar to that described in FIG. 8; however, only one junction cell is shown. Also, in this layout, the programmable junction cell is compacted by serpentining the floating gate 620 when it forms interconnect element 610. This gate, instead of extending in a single direction, has several forty-five degree turns in order to obtain a similarly sized gate length as in FIG. 8, but using less silicon area. Specifically, a first portion 903 of the gate extends in a first direction. This gate has a first forty-five degree turn 905 and a second forty-five degree turn 910. A second portion 915 of the gate extends in a direction transverse to first portion 903. The gate further has a first negative forty-five degree turn 920 and a second negative forty-five degree turn 930. A third portion 935 of the gate extends in a direction parallel to first portion 903.

Figure 10:
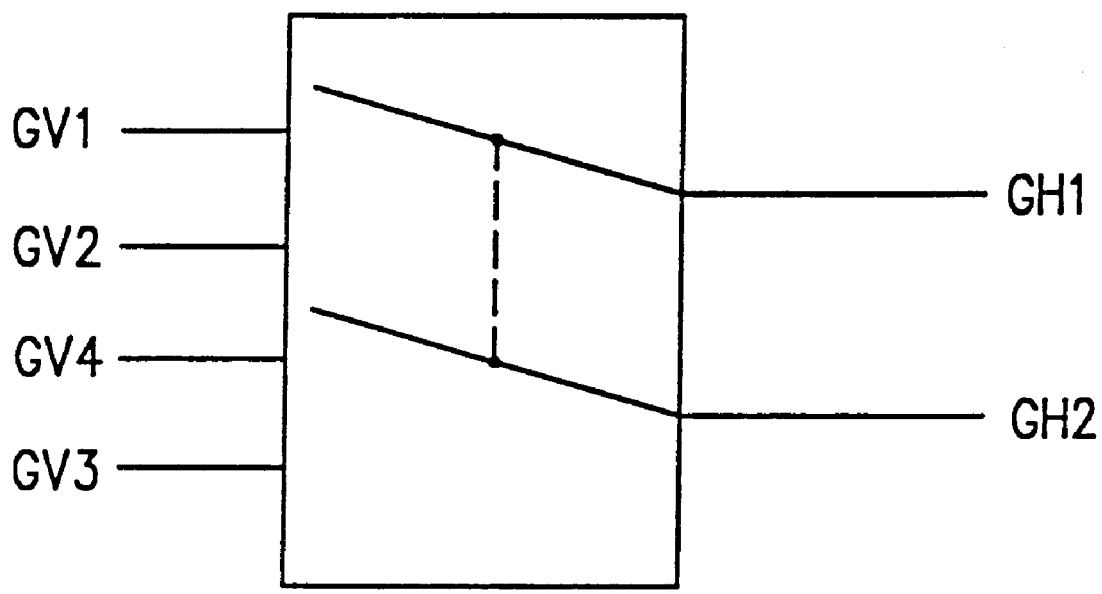
FIG. 10 shows a four-to-two multiplexer implemented using programmable interconnect.

FIG. 10 show a four-to-two multiplexer implemented using GH and GV interconnect. There are two GH conductors, GH1 and GH2, and four GV conductors, GV1, GV2, GV3, and GV4. In a first state of the multiplexer, GV1 is programmably coupled to GH1, and GV4 is programmably coupled to GH2. In a second state of the multiplexer, GV2 is programmably coupled to GH1, and GV3 is programmably coupled to GH2.

Figure 11:
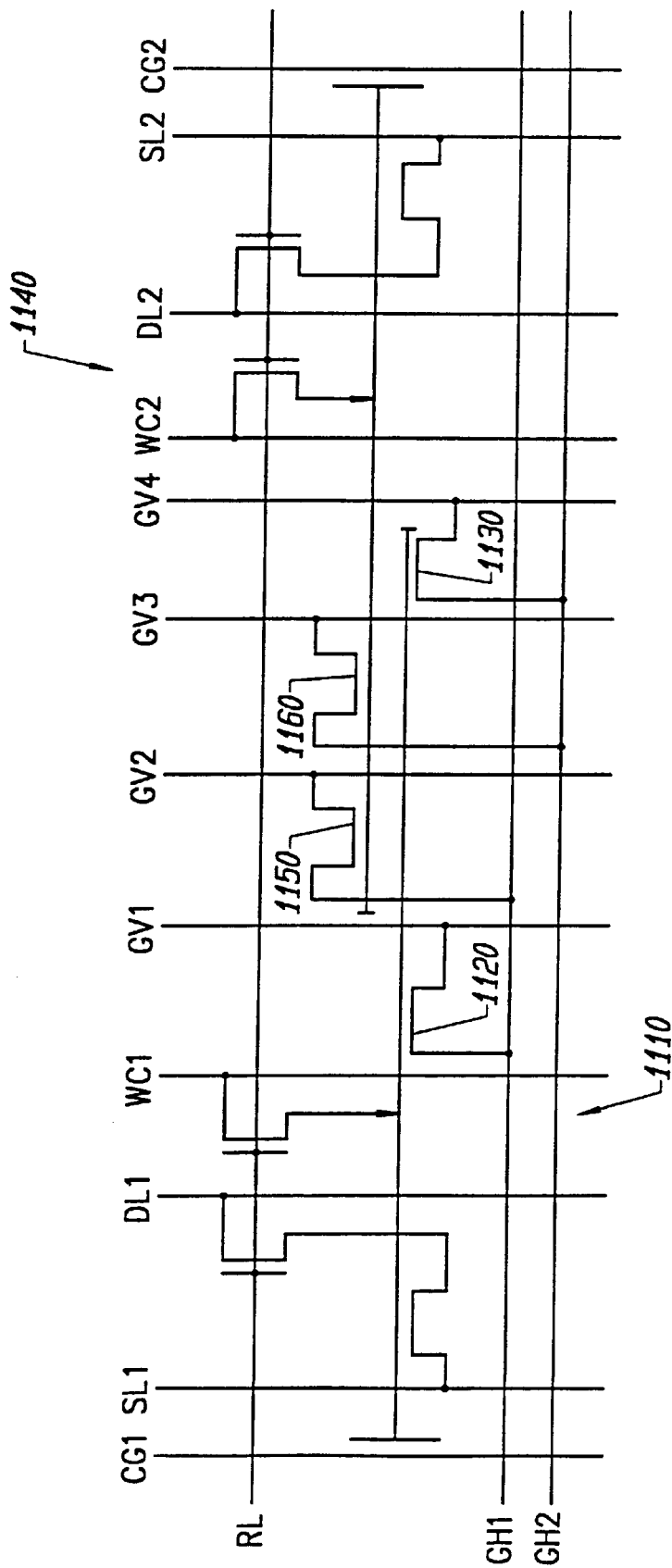
FIG. 11 shows an implementation of the four-to-two multiplexer of FIG. 10 using the programmable interconnect junction cell of the present invention.

FIG. 11 implements the logical function of FIG. 10 using the programmable junction cell shown in FIG. 6A. In this embodiment of the present invention, each programmable junction cell contains a plurality of interconnect elements. Specifically, each programmable junction cell has two interconnect elements. In other embodiments of the present invention, programmable junction cells may have more than two interconnect elements. These programmable junction cells have a structure and operate similarly to the cell described in FIG. 6A above. The differences between the cells of this figure and FIG. 6A are noted below.

A first programmable junction 1110 has two interconnect elements 1120 and 1130. Interconnect elements 1120 and 1130 share a common floating gate; these interconnect elements are in a similar configured state at the same time. For example, when interconnect element 1120 is programmed, so is interconnect element 1130. It may be economical to increase a number of interconnect elements per programmable junction cell in order to perform certain logical functions. For example, in this four-to-two multiplexer implementation, less silicon area is required, especially when compared to a implementation where four separate, complete programmable junction cells of FIG. 6A are used. Other logical functions may also similarly benefit from this feature of the present invention.

Interconnect element 1120 programmably couples GH1 and GV1, and interconnect element 1130 programmably couples GH2 and GV4. For example, when erased, interconnect element 1120 couples GH1 to GV1, and interconnect element 1130 couples GH2 to GV4.

Like first programmable junction 1110, a second programmable junction 1140 has two interconnect elements 1150 and 1160. Interconnect element 1150 programmably couples GH1 and GV2, and interconnect element 1160 programmably couples GH2 and GV3.

The circuitry in FIG. 11 implements the function as described in FIG. 10. For example, in the first state, interconnect elements 1120 and 1130 are erased, while interconnect elements 1150 and 1160 are programmed. Then, GH1 will be programmably coupled to GV1, and GH2 to GV4. In the second state, interconnect elements 1120 and 1130 are programmed, while interconnect element 1150 and 1160 erased. Then, GH1 will be programmably coupled to GV2, and GH2 to GV3.

Figure 12:
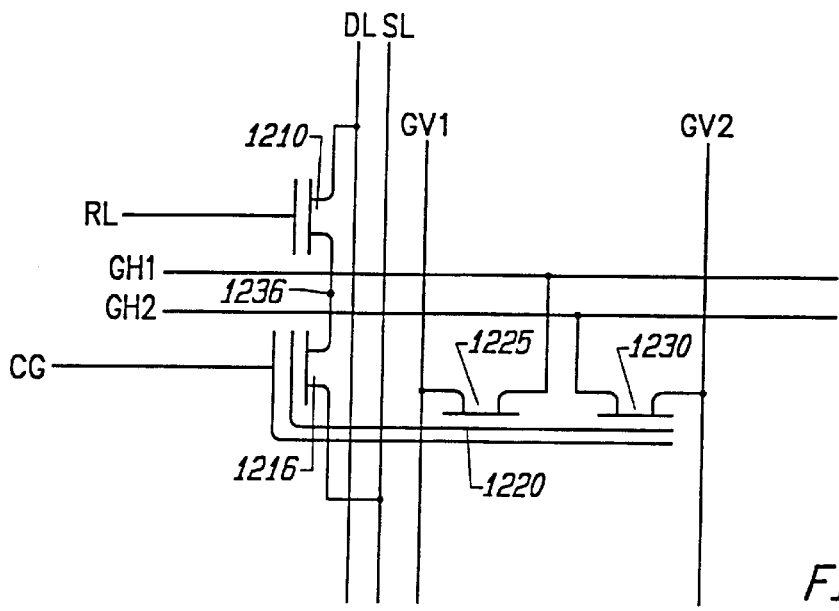
FIG. 12 shows a programmable interconnect junction cell of the present invention implemented using two-transistor Flash EEPROM technology.

FIG. 12 is a implementation of a programmable interconnect junction cell having two interconnect elements using two-transistor Flash or EEPROM technology. More specifically, a read device 1210 and a program device 1216 are serially coupled between DL and SL. An RL line is coupled to a control node of read device 1210. A CG line is coupled to a control gate of program device 1216. Read device 1210 and program device 1216 may be NMOS transistors. Moreover, in a preferred embodiment, program device 1216 is a Flash transistor.

Program device 1216 shares a floating gate 1220 with a first interconnect element 1225 and a second interconnect element 1230. First interconnect element programmably couples GV1 and GH1. Second interconnect element programmably couples GV2 and GH2. A tunnel dielectric 1236, between read device 1210 and program device 1216, is used for transferring electrons to floating gate 1220. This tunnel dielectric 1236 may extend completely, or partially, over the channel region of program device 1216. In an alternative embodiment, program device 1216 may be coupled to tunnel dielectric 1236, but tunnel dielectric 1236 does not necessarily extend into the channel region.

This programmable junction implementation operates somewhat similarly to the one described in FIG. 6A. Sharing the same floating gate 1220, program device 1216 and interconnect elements 1225 and 1230 are in a similar configuration state simultaneously. The programmable junction may be programmed using hot electrons by effecting a sufficiently large current between DL and SL and through program device 1216, as discussed above. Hot electrons will become trapped into floating gate 1220, which programs the cell. The programmable junction is erased using Fowler-Nordheim tunneling as described above.

Figure 13:
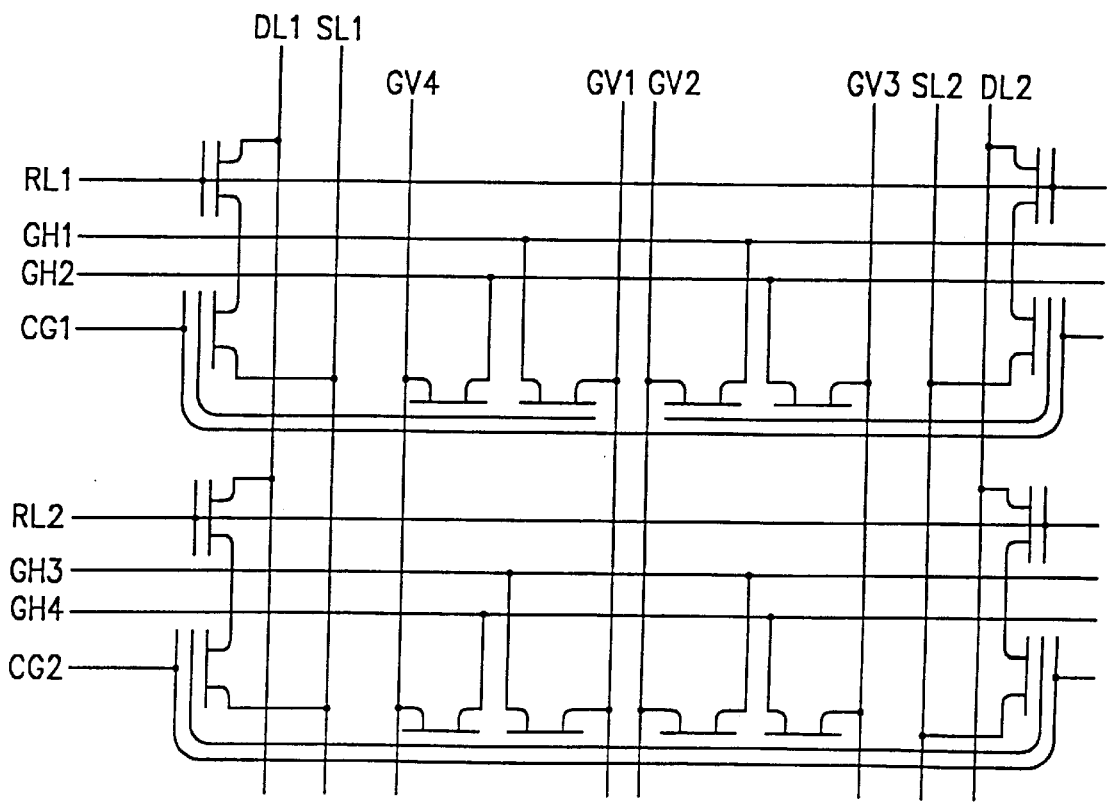
FIG. 13 shows an array of the programmable interconnect junction cells of FIG. 12.

More specifically, for EEPROM operation, in the embodiment of FIG. 12, an array of such programmable junctions (such as shown in FIG. 13) is initialized by bulk programming. CG is coupled to VPP. DL is grounded. RL is placed at a voltage sufficient to turn read device 1210 on, which is typically about 2 volts or above. Then, tunnel diode (not shown), coupled to a source of read device 1210 and beneath tunnel dielectric 1236, is grounded. Electrons tunnel from the tunnel diode, through tunnel dielectric 1236, to floating gate 1220. As a result interconnect elements 1225 and 1230, as well as device 1216, are programmed to the high VTP state. VTP is typically about 5 volts.

As discussed above, an assist technique may also be used to boost VTP. Assist programming may be accomplished by coupling GV1 or GV2, or both, to a high voltage such as VDD, or even higher.

Under EEPROM operation, programmable junctions in an array are selectively erased to a low VT state. The erase operation is by Fowler-Nordheim tunneling as described above. Specifically, CG is grounded or placed at a negative voltage (for negative assist programming). DL is coupled to VEE. In order to pass VEE to the tunnel diode, the appropriate RL (coupled to the programmable junctions to be erased) is coupled to VEE+VT or above. GV1 and GV2 may be floating or grounded. SL may be floating. Electrons will tunnel from floating gate 1220 through tunnel dielectric 1236 to the tunnel diode. Interconnect elements 1225 and 1230 and program device 1216 are erased to a low VT state.

For Flash operation, an array of programmable junctions is initialized by bulk or blanket using Fowler-Nordheim tunneling. CG is grounded or placed at a negative voltage (for negative assist programming). DL is coupled to VEE. The RLs for the array are coupled to VEE+VT in order to pass VEE to the tunnel diode. Electrons will tunnel from floating gate 1220 through tunnel dielectric 1236 to the tunnel diode for each of the programmable junctions. As a result, the array is bulk erased.

During Flash operation, an array of programmable junctions is selectively programmed. Similar to the technique described above, a programming current may be induced from SL to DL for the selected devices to be programmed. This programming current of about 500 microamps generates hot electrons which become trapped in floating gate 1220. The selected programmable junction and corresponding program device 1216 and interconnect junctions 1225 and 1230 become programmed to a high VT state.

As described above, when programming an array of such programmable junctions, precautions should be taken in order to minimize disturbing the unselected programmable junctions. For example, for the selected cells, the programming conditions may be: CG is coupled to VPP. SL is coupled to an intermediate voltage, VPD, of about 6 volts to about 8 volts. DL is grounded. RL should be at a voltage in order to minimize the on resistance of read device 1210. For example, this voltage may be VPP+VT. Assist programming may be used to boost VTP. For example, a high voltage such as VDD or above may be coupled to GV1 or GV2, or both. As described above, selective programming may also be achieved by inducing programming current from DL to SL for the selected devices to be programmed. For example, CG would be coupled to VPP. SL is grounded. DL is coupled to VPD, which would be about 7 volts to about 10 volts. RL should be set to VPP+VT. Assist programming may also be used for this embodiment of the present invention if DL, is high, similarly as described above.

To avoid disturbing other programmable junctions in an array, CG for unselected rows may be set at an intermediate CG voltage of about 5 volts. Depending on the specific technology used and implementation, this voltage may be in the range from about ground to about 12 volts. This will tend to help minimize stress on the tunnel oxide. Further, for programmable junctions in the same row as the selected programmable junction, SL or DL for the unselected cells may be set to about 2 volts to relax electric field stress on the tunnel dielectric.

The programmable junction in FIG. 12 also allows margin testing to evaluate the programming and erase margin. A technique such as described above may be utilized.

FIG. 13 is a simplified layout diagram for an array of programmable interconnect junctions of FIG. 12. There are four programmable interconnect junction cells. Larger arrays containing greater numbers of cells may be built along the same lines. There are four GH conductors (i.e., GH1, GH2, GH3, and GH4) in a first direction. There are four GV conductors (i.e., GV1, GV2, GV3, and GV4) in a second direction, transverse to the first direction. Two cells are in a first row of the array. They are coupled using RL1 and CG1 lines in the first direction. Similarly, in a second row, two cells are coupled using RL2 and CG2 lines in the first direction. In a first column, cells are coupled using DL1 and SL1 lines while in a second column, cells are coupled using DL2 and SL2 lines.

Arranged in a grid system, the programmable interconnect junctions are selectively configurable by applying the proper voltages to the appropriate control lines. Furthermore, this array of programmable interconnect junctions permits margin testing of the programmable junctions using techniques similar to those already described. A row of programmable junctions may be selectively margin tested via the program devices by enabling the read device for that row. During margin testing, the read devices may be used to select which program cell to test. More specifically, a read device couples a program device to a DL line, while other read devices decouple their respective program devices from the same DL line. Margin is evaluated for this read device coupled to the DL line. Therefore, individual cells may be margin tested using this technique.

Figure 14:
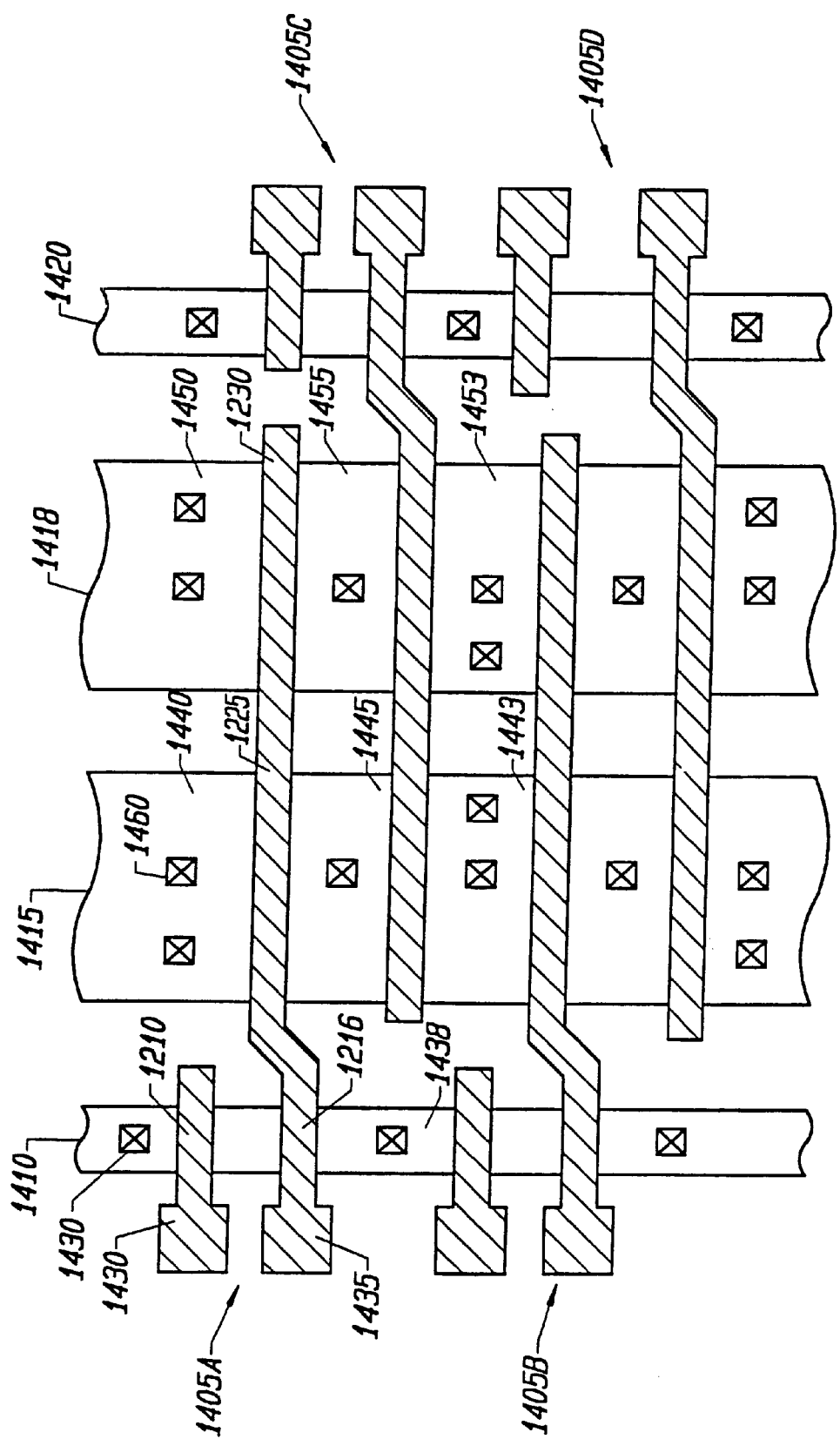
FIG. 14 shows a layout of the programmable interconnect junction cells of FIG. 12.

FIG. 14 shows a layout of an array of programmable junction cells of FIG. 13. Four programmable junction cells 1405A, 1405B, 1405C, and 1405D, are compactly layed out. There are diffusion layers 1410, 1415, 1418, and 1420, which are typically n-type diffusion. Taking programmable junction cell 1405A as representative, a polysilicon layer 1430 forms read device 1210 of FIG. 12. Polysilicon 1430 will be coupled to an RL line signal. Floating gate 1435, also polysilicon, forms program device 1216 in diffusion layer 1410. A diffusion region 1437 will be coupled to a DL line while a diffusion region 1438 will be coupled to a SL line.

Floating gate 1435 also forms interconnect element 1225 and 1230 in diffusion layers 1415 and 1418, respectively. Diffusion regions 1440 and 1443 may be coupled to GV conductors while a diffusion region 1445 may be coupled to a GH conductor. Similarly, diffusion regions 1450 and 1453 may be coupled to GV conductors while a diffusion region 1455 is coupled to a GH conductor. The diffusion regions may be coupled to the appropriate conductor, such as first metal (not shown), using contacts 1460. Programmable junction cells 1405B, 1405C, and 1405D are similar to junction cell 1405A.

Figure 15:
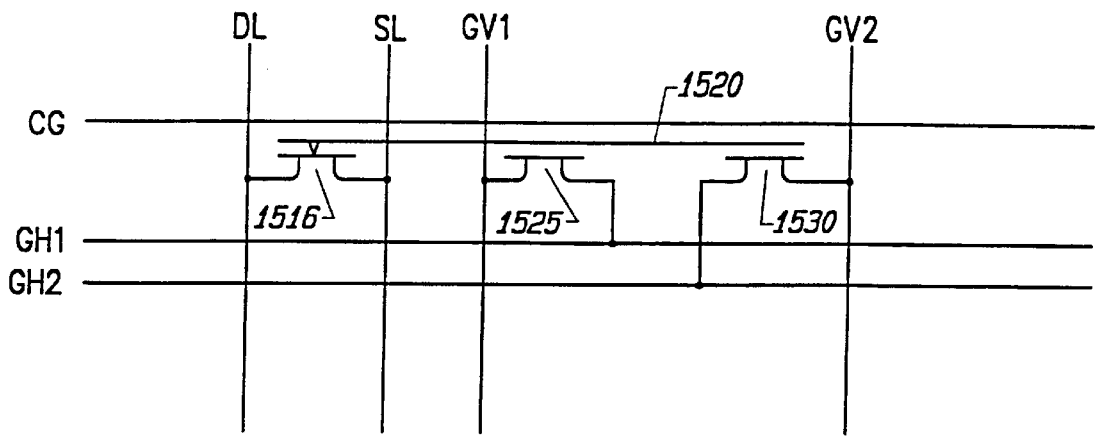
FIG. 15 shows a programmable interconnect junction cell of the present invention implemented using one-transistor Flash EEPROM technology.

FIG. 15 is an implementation of a programmable interconnect junction cell having two interconnect elements using one-transistor Flash technology. More specifically, a program device 1516 is coupled between DL and SL. A CG line is coupled to a control gate of program device 1516. Program device 1516 may be an NMOS transistor, and moreover, in a preferred embodiment, program device is a Flash transistor. Program device 1516 shares a floating gate 1520 with a first interconnect element 1525 and a second interconnect element 1530. First interconnect element programmably couples GH1 and GV1. Second interconnect element programmably couples GH2 and GV2.

This programmable junction implementation operates somewhat similarly to that described in FIG. 12. This implementation may be somewhat more compact since a read device has been omitted. Sharing the same floating gate 1520, program device 1516 and interconnect elements 1525 and 1530 are in a similar configuration state simultaneously. For initialization, an array is bulk erased. For example, CG is grounded or negative (for negative assist). DL is coupled to VEE. GH1, GH2, GV1, and GV2 are floating or grounded. Similar to the above description for Flash technology, the programmable junction may be selectively programmed using hot electrons by effecting a sufficiently large programming current from SL to DL, or vice versa, and through program device 1516. Hot electrons will become trapped in floating gate 1520, which programs the cell. The programmable junction is erased using Fowler-Nordheim tunneling as described above. The programmable junction in FIG. 12 may be margin tested to evaluate the programming and erase margin. For example, a voltage at the control gate is swept until program device 1516 conducts.

Figure 16:
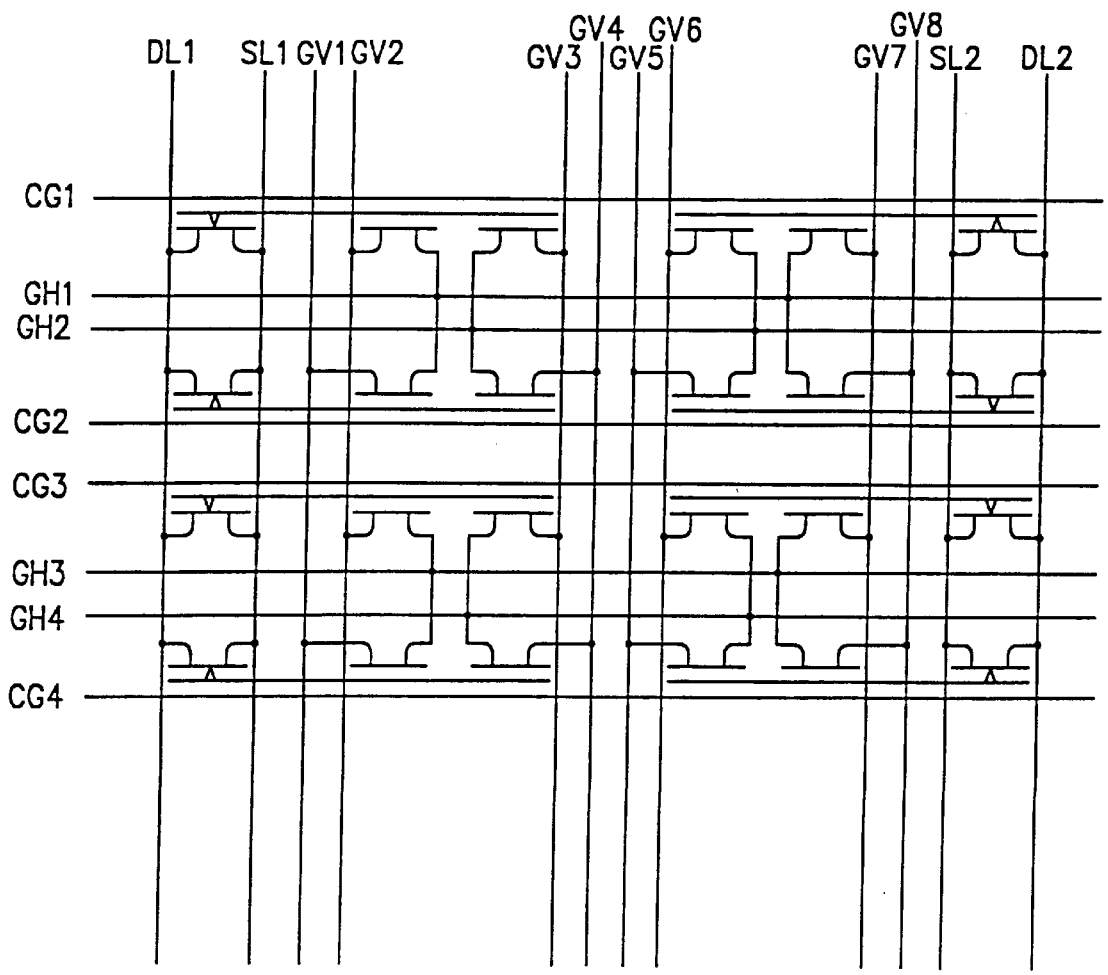
FIG. 16 shows an array of the programmable interconnect junction cells of FIG. 15.

FIG. 16 shows a simplified layout diagram for an array of programmable interconnect junctions of FIG. 15. There are eight programmable interconnect junction cells, arranged four rows by two columns. Larger arrays containing greater numbers of cells may be built using similar principles. There are four GH conductors (i.e., GH1, GH2, GH3, and GH4) in a first direction. There are eight GV conductors (i.e., GV1–GV8) in a second direction, transverse to the first direction. Cells in a row are coupled by a respective CG line (i.e., CG1, CG2, CG3, and CG4) in the first direction. Cells in the a column are coupled by respective DL and SL lines (i.e., DL1 and SL1, DL2 and SL2).

To implement the cell of FIG. 15 in an array while taking advantage of the compact layout of the single Flash transistor configuration requires careful consideration of the physical design and operating conditions of program device 1516. Unlike typical Flash memory devices, program device 1516 may be erased deeply so as to ensure that interconnect elements 1225 and 1230 will be in a conducting state even when a full-rail power supply voltage (e.g., VDD) is applied to both GV and GH lines.

Typically, the erase operation will cause the floating gate voltage to reach about 3 volts or above when the device is in a so called "shelf-storage condition" with no voltages applied. A voltage above this leads to a severe risk of undesired tunneling (e.g., a disturb condition), and hence degradation of the floating gate voltage, during storage. In normal operation, the control gate will typically be biased to a value above zero volts, perhaps even above VDD. This will boost the floating gate voltage to a value between about 4 volts and 5 volts, which should be sufficient for operation with a 3.3 volt power supply. At the same time, the DL line may be biased to a positive voltage, typically less than VDD, to relax the stress across the tunnel node.

For a typical Flash memory technology, the 3 volt floating gate voltage after erasure will cause program device 1516 to be normally conducting. It is important that erased devices can be turned off during margining operations, and also during programming of other devices in the array which share the same SL and DL lines. Otherwise, false margin values and undesired programming can result. There are several techniques which can be used to turn the erased device off during margining and programming operations.

One such technique is to employ negative control gate voltages during margining and on unselected control gates during programming. In this way, only the specific device being margined or programmed will be conducting. Another method is to design the program device in such a way that it is nonconducting even with 3 volts or more on the floating gate. This can be achieved, for example, by increasing the impurity or doping level in the substrate beneath the floating gate on the SL side of the program device. By selectively increasing the doping under the floating gate of the program device, but not under the floating gates of the interconnect devices, the desired nonconducting behavior of the program device can be achieved without adversely affecting the interconnect gate operation.

Clearly, from the above discussion, there are challenges in implementing a one-transistor Flash programming path programmable interconnect. However, these challenges may be successfully overcome by many different techniques such as the ones discussed above. Furthermore, there are many other techniques which may also be used.

The array may be bulk erased, for example by applying VEE to the DL lines and ground or VSS to the CG lines. GV and GH lines may be coupled to VSS or floating. Tunneling current will flow between the floating gates 1520 and the DL lines, removing electrons from the floating gates and causing the cells to be erased. The programmable interconnect junctions are selectively programmable similarly as discussed above. A programmed or erased device in the array may be margin tested by sweeping the appropriate CG line until the device begins to conduct while other devices are held in a nonconducting state as discussed above.

There are many different techniques for margin testing the embodiment of FIG. 16. For example, in an embodiment of the present invention, rows of programmable junction cells in FIG. 16 may be placed in separate substrate regions. By negatively biasing a substrate of a program device, that device will be effectively turned off. Then, during margin testing, a program device in a substrate region may be effectively decoupled form the DL and SL lines by negatively biasing that substrate region. Consequently, individual programmable junctions cells may be margin tested. However, this approach has limited applications since providing separated substrate regions makes fabrication substantially more complex, which will adversely affect process yield. Negative voltage generation adds further complication to the circuitry and design of the integrated circuit. Moreover, generating negative voltage requires special techniques (possibly requiring additional silicon area) to prevent potential problems such as latch-up which may damage the integrated circuit.

Another technique for selectively margin testing the programmable junction, without separate substrate regions, involves turning off the program device by way of selectively applying negative voltages on the CG lines. As shown in FIG. 16, there are a plurality of CG lines, one for each row of programmable junction cells. Programmable junction cells may be selectively decoupled from the DL line by placing a voltage level below the threshold voltage of the program device on the CG line. As discussed earlier, when a program device is erased to a low VT state, VTP may be about zero volts, or negative. Therefore, to ensure that a particular program device is off during margin testing, the voltage at the respective CG line should be negative. For example, this voltage may be −2 volts or less. However, as discussed earlier, there are inherent risks and difficulties when generating and logically switching negative voltages on the integrated circuit.

Furthermore, still further techniques for evaluating cell margin are possible. For example, margin may be found by evaluating an impedance of the program device. This may involve making measurements under various voltage, current, and bias conditions for generating an impedance curve. The margin of the cell may be extrapolated and extracted using information from this curve. However, evaluating margin using this technique may require more time and computational resources (e.g., generating the impedance curve) than those previously discussed. Also, in this technique, the margin is, more or less, predicted or estimated. Techniques presented earlier would provide more precise results since margin is evaluated directly.

As another example, margin of the program cell may be evaluated by detecting whether or not the cell conducts when the CG line is grounded. This is a variation of the impedance curve technique, where the cell conduction when CG is zero volts may be compared with known results in order to predict margin. However, this technique has similar drawbacks as discussed above. As can be seen, there are various techniques for evaluating margin, each technique having its advantages and disadvantages.

Figure 17:
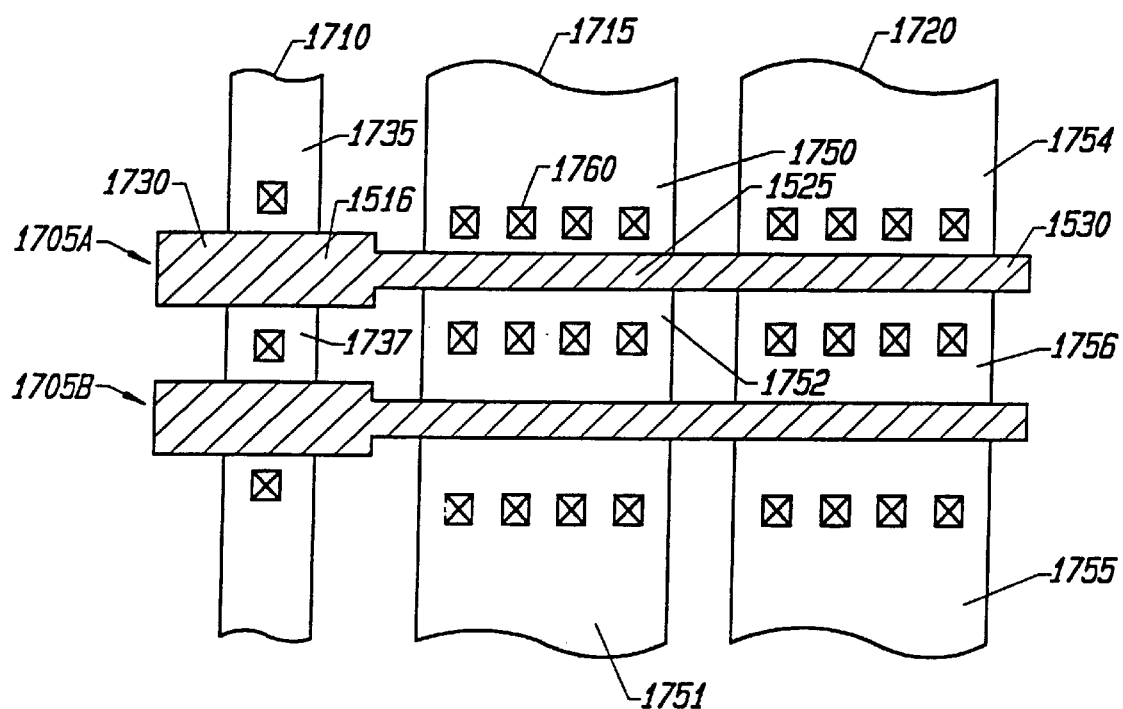
FIG. 17 shows a layout of the programmable interconnect junction cells of FIG. 15.

FIG. 17 shows a layout of programmable junction cells of FIG. 15. Two programmable junction cells, 1705A and 1705B, are shown. There are diffusion layers (or active regions) 1710, 1715, and 1720, which are typically n-type diffusion. Taking programmable junction cell 1705A as an example, a floating gate 1730, fabricated using polysilicon, forms program device 1516 of FIG. 15. A diffusion region 1735 may be coupled to a DL line and a diffusion region 1737 may be coupled to an SL line. Floating gate 1730 also forms interconnect element 1525 and 1530. Diffusion regions 1750 and 1751 are coupled to a GV conductors while a diffusion region 1752 is coupled to a GH conductor. Similarly, diffusion regions 1754 and 1755 are coupled to GV conductors while a diffusion region 1756 is coupled to a GH conductor. These diffusion regions may be coupled to the appropriate conductor, such as first, second, or third metal (not shown), using contacts 1760 to connect to other components in the integrated circuit. Programmable junction cell 1705B is similar to junction cell 1705A.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. A method of margin testing an array of programmable interconnect junction cells comprising:

choosing a selected programmable interconnect junction cell to margin test;

decoupling other programmable interconnect junction cells from a test node; and evaluating the margin of the selected programmable interconnect junction cell.

2. The method of claim 1 wherein the evaluating step comprises:

exercising a program device of the selected programmable interconnect junction cell to determine a margin of an interconnect element of the selected programmable interconnect junction cell.

3. The method of claim 1 wherein the evaluating step comprises:

determining an impedance of a program device of the selected programmable interconnect junction cell to determine a margin of an interconnect element of the selected programmable interconnect junction cell.

4. The method of claim 1 wherein the evaluating step comprises:

sweeping a control gate of the selected programmable interconnect junction cell until a program device of the selected programmable interconnect junction cell conducts current; and detecting the current of the program device at the test node.

5. The method of claim 2 wherein the decoupling step comprises:

turning off a read device of the selected programmable interconnect junction cell, wherein said read device is serially coupled between the test node and the program device.

6. The method of claim 1 wherein the decoupling step comprises:

supplying a negative voltage to control gate nodes of the other programmable interconnect junction cells.

7. The method of claim 1 wherein the decoupling step comprises:

back biasing a substrate connection of the other programmable interconnect junction cells.

8. The method of claim 1 wherein evaluating comprises:

sweeping a voltage at a control gate of the selected programmable interconnect junction cell until a program device stops conducting current; and using the voltage at which the program device stops conducting as a measure of the margin of the selected programmable interconnect junction cell.

9. The method of claim 1 wherein the selected programmable interconnect cell is formed by a method comprising:

providing a floating gate of a memory cell;

providing a tunnel diode of the memory cell;

providing a tunnel dielectric of the memory cell to transfer electrons between the tunnel diode and the floating gate;

providing a margin device of the memory cell to permit evaluation of a programming margin of the memory cell; and providing a switch coupled between a first conductor and a second conductor, wherein the floating gate of the memory cell is a control node of the switch.

10. The method of claim 9 further comprising:

providing a memory transistor where the floating gate is a control node of the memory transistor;

serially coupling the margin device and memory transistor between a drain line and a source line; and controlling the margin device to isolate the drain line from the memory transistor.

11. The method of claim 1 wherein the selected programmable interconnect cell is formed by a method comprising:

providing a first interconnect line;

providing a second interconnect line;

providing an interconnect element to programmably couple the first interconnect line to the second interconnect line;

providing a floating gate to programmably control the interconnect element; and providing a margin device coupled to permit evaluation of a programming margin of the floating gate, wherein the selected interconnect element is a first transistor and the floating gate is a gate of the first transistor.

12. The method of claim 11 wherein the selected interconnect element is an NMOS transistor.

13. The method of claim 1 wherein the selected programmable interconnect cell is formed by a method comprising:

providing a floating gate;

providing a row-line conductor;

providing in a first active region, a switch transistor formed by the floating gate, wherein the floating gate programmably couples a first node of the switch transistor and a second node of the switch transistor; and providing in a second active region, a read transistor formed by the row-line conductor; and providing in the second active region, a program transistor formed by the floating gate and serially coupled to the read transistor.

14. The method of claim 13 further comprising:

providing in a third active region, a control gate capacitor coupled to the floating gate.

15. The method of claim 14 further comprising:

providing in the third active region, a tunnel diode beneath a tunnel dielectric and the floating gate; and permitting charge to transfer between the tunnel diode and the floating gate through the tunnel dielection.

* * * * *